(12) United States Patent
Yamazaki et al.

(10) Patent No.: US 12,426,366 B2
(45) Date of Patent: Sep. 23, 2025

(54) SEMICONDUCTOR DEVICE

(71) Applicant: Semiconductor Energy Laboratory Co., Ltd., Atsugi (JP)

(72) Inventors: Shunpei Yamazaki, Setagaya (JP);
Daisuke Matsubayashi, Atsugi (JP);
Yutaka Okazaki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 174 days.

(21) Appl. No.: 17/826,265

(22) Filed: May 27, 2022

(65) Prior Publication Data
US 2022/0293798 A1 Sep. 15, 2022

Related U.S. Application Data

(63) Continuation of application No. 16/821,433, filed on Mar. 17, 2020, which is a continuation of application
(Continued)

(30) Foreign Application Priority Data

Jan. 20, 2012 (JP) ................... 2012-009722

(51) Int. Cl.
*H10D 86/40* (2025.01)
*H10D 30/67* (2025.01)
(Continued)

(52) U.S. Cl.
CPC ....... *H10D 86/481* (2025.01); *H10D 30/6739* (2025.01); *H10D 30/6755* (2025.01);
(Continued)

(58) Field of Classification Search
CPC ........... H01L 29/7869; H01L 29/78693; H01L 27/1225; H01L 27/1255; H01L 29/04;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 0810669 A 12/1997
EP 0823207 A 2/1998
(Continued)

OTHER PUBLICATIONS

Fortunato.E et al., "Wide-Bandgap High-Mobility ZNO Thin-Film Transistors Produced At Room Temperature", Appl. Phys. Lett. (Applied Physics Letters), Sep. 27, 2004, vol. 85, No. 13, pp. 2541-2543.
(Continued)

*Primary Examiner* — Aaron J Gray
(74) *Attorney, Agent, or Firm* — Eric J. Robinson; Robinson Intellectual Property Law Office, P.C.

(57) ABSTRACT

A transistor in which a short-channel effect is not substantially caused and which has switching characteristics even in the case where the channel length is short is provided. Further, a highly integrated semiconductor device including the transistor is provided. A short-channel effect which is caused in a transistor including silicon is not substantially caused in the transistor including an oxide semiconductor film. The channel length of the transistor including the oxide semiconductor film is greater than or equal to 5 nm and less than 60 nm, and the channel width thereof is greater than or equal to 5 nm and less than 200 nm. At this time, the channel width is made 0.5 to 10 times as large as the channel length.

4 Claims, 23 Drawing Sheets

Related U.S. Application Data

No. 13/735,424, filed on Jan. 7, 2013, now abandoned.

(51) Int. Cl.
  *H10D 62/40* (2025.01)
  *H10D 86/60* (2025.01)

(52) U.S. Cl.
  CPC ......... *H10D 30/6757* (2025.01); *H10D 62/40* (2025.01); *H10D 86/423* (2025.01); *H10D 86/441* (2025.01); *H10D 86/471* (2025.01); *H10D 86/60* (2025.01)

(58) Field of Classification Search
  CPC .. H10D 86/421; H10D 86/423; H10D 86/425; H10D 86/471; H10D 86/441; H10D 86/481
  See application file for complete search history.

(56) References Cited

U.S. PATENT DOCUMENTS

| | | |
|---|---|---|
| 5,744,864 A | 4/1998 | Cillessen et al. |
| 5,952,675 A | 9/1999 | Katoh |
| 5,972,509 A | 10/1999 | Ito |
| 6,232,642 B1 | 5/2001 | Yamazaki |
| 6,294,274 B1 | 9/2001 | Kawazoe et al. |
| 6,479,838 B2 | 11/2002 | Morosawa |
| 6,563,174 B2 | 5/2003 | Kawasaki et al. |
| 6,576,924 B1 | 6/2003 | Yamazaki et al. |
| 6,727,522 B1 | 4/2004 | Kawasaki et al. |
| 6,774,397 B2 | 8/2004 | Arao et al. |
| 6,818,485 B2 | 11/2004 | Morosawa |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,095,047 B2 | 8/2006 | Arao et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,288,789 B2 | 10/2007 | Yamazaki et al. |
| 7,297,977 B2 | 11/2007 | Hoffman et al. |
| 7,323,356 B2 | 1/2008 | Hosono et al. |
| 7,335,597 B2 | 2/2008 | Arao et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,804,091 B2 | 9/2010 | Takechi et al. |
| 7,884,360 B2 | 2/2011 | Takechi et al. |
| 7,972,898 B2 | 7/2011 | Cowdery-Corvan et al. |
| 8,207,531 B2 | 6/2012 | Takahashi et al. |
| 8,232,124 B2 | 7/2012 | Takechi et al. |
| 8,232,598 B2 | 7/2012 | Yamazaki et al. |
| 8,339,836 B2 | 12/2012 | Yamazaki et al. |
| 8,395,931 B2 | 3/2013 | Yamazaki et al. |
| 8,406,038 B2 | 3/2013 | Saito et al. |
| 8,420,442 B2 | 4/2013 | Takechi et al. |
| 8,437,165 B2 | 5/2013 | Yamazaki et al. |
| 8,441,007 B2 | 5/2013 | Arai |
| 8,461,594 B2 | 6/2013 | Morosawa et al. |
| 8,481,377 B2 | 7/2013 | Akimoto et al. |
| 8,487,303 B2 | 7/2013 | Takemura |
| 8,492,853 B2 | 7/2013 | Takemura |
| 8,525,304 B2 | 9/2013 | Endo et al. |
| 8,530,289 B2 | 9/2013 | Yamazaki |
| 8,587,999 B2 | 11/2013 | Yamazaki et al. |
| 8,598,648 B2 | 12/2013 | Kato et al. |
| 8,605,477 B2 | 12/2013 | Takemura |
| 8,610,187 B2 | 12/2013 | Yamazaki et al. |
| 8,624,245 B2 | 1/2014 | Yamazaki |
| 8,629,434 B2 | 1/2014 | Arai |
| 8,669,148 B2 | 3/2014 | Yamazaki |
| 8,680,679 B2 | 3/2014 | Godo et al. |
| 8,742,418 B2 | 6/2014 | Morosawa et al. |
| 8,748,881 B2 | 6/2014 | Yamazaki |
| 8,767,442 B2 | 7/2014 | Matsuzaki et al. |
| 8,779,420 B2 | 7/2014 | Yamazaki |
| 8,809,851 B2 | 8/2014 | Yamazaki et al. |
| 8,811,066 B2 | 8/2014 | Yamazaki et al. |
| 8,884,283 B2 | 11/2014 | Kato |
| 8,889,480 B2 | 11/2014 | Takechi et al. |
| 8,895,377 B2 | 11/2014 | Yamazaki |
| 8,927,349 B2 | 1/2015 | Yamazaki |
| 8,999,811 B2 | 4/2015 | Endo et al. |
| 9,007,813 B2 | 4/2015 | Saito et al. |
| 9,059,295 B2 | 6/2015 | Yamazaki |
| 9,099,499 B2 | 8/2015 | Yamazaki |
| 9,112,043 B2 | 8/2015 | Arai |
| 9,123,574 B2 | 9/2015 | Yamazaki et al. |
| 9,142,549 B2 | 9/2015 | Takemura |
| 9,209,026 B2 | 12/2015 | Takechi et al. |
| 9,214,520 B2 | 12/2015 | Yamazaki |
| 9,240,488 B2 | 1/2016 | Yamazaki et al. |
| 9,245,983 B2 | 1/2016 | Yamazaki |
| 9,324,881 B2 | 4/2016 | Yamazaki |
| 9,336,858 B2 | 5/2016 | Yamazaki et al. |
| 9,378,980 B2 | 6/2016 | Yamazaki et al. |
| 9,396,939 B2 | 7/2016 | Endo et al. |
| 9,728,651 B2 | 8/2017 | Yamazaki et al. |
| 9,735,284 B2 | 8/2017 | Yamazaki |
| 9,887,298 B2 | 2/2018 | Yamazaki |
| 9,978,757 B2 | 5/2018 | Yamazaki et al. |
| 10,014,415 B2 | 7/2018 | Yamazaki |
| 10,263,120 B2 | 4/2019 | Yamazaki |
| 10,453,846 B2 | 10/2019 | Matsuzaki. et al. |
| 10,505,049 B2 | 12/2019 | Yamazaki |
| 10,608,118 B2 | 3/2020 | Yamazaki |
| 10,749,033 B2 | 8/2020 | Godo et al. |
| 10,861,983 B2 | 12/2020 | Yamazaki |
| 11,133,419 B2 | 9/2021 | Yamazaki |
| 11,342,464 B2 | 5/2022 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0096999 A1* | 5/2004 | Lin ............... H10D 30/6715 438/164 |
| 2004/0127038 A1 | 7/2004 | Carcia et al. |
| 2005/0017302 A1 | 1/2005 | Hoffman |
| 2005/0072754 A1* | 4/2005 | Shih .............. H10D 86/0231 257/E27.113 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0199305 A1 | 9/2006 | Chen et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |

(56) References Cited

U.S. PATENT DOCUMENTS

| | | |
|---|---|---|
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140608 A1 | 6/2010 | Park et al. |
| 2010/0301340 A1 | 12/2010 | Shih et al. |
| 2011/0090204 A1 | 4/2011 | Yamazaki et al. |
| 2011/0115006 A1 | 5/2011 | Sato |
| 2011/0127523 A1 | 6/2011 | Yamazaki |
| 2011/0133191 A1 | 6/2011 | Yamazaki |
| 2011/0147737 A1 | 6/2011 | Yamazaki et al. |
| 2011/0147738 A1 | 6/2011 | Yamazaki et al. |
| 2011/0182110 A1 | 7/2011 | Yamazaki et al. |
| 2011/0204362 A1 | 8/2011 | Akimoto et al. |
| 2011/0215326 A1 | 9/2011 | Godo et al. |
| 2011/0228584 A1 | 9/2011 | Takemura |
| 2011/0240998 A1 | 10/2011 | Morosawa et al. |
| 2011/0255325 A1* | 10/2011 | Nagatsuka ............. H10B 41/70 365/72 |
| 2011/0263084 A1 | 10/2011 | Yamazaki |
| 2011/0284846 A1 | 11/2011 | Endo et al. |
| 2012/0138922 A1 | 6/2012 | Yamazaki et al. |
| 2012/0146109 A1 | 6/2012 | Yamazaki et al. |
| 2012/0181597 A1 | 7/2012 | Takemura |
| 2012/0217499 A1 | 8/2012 | Endo et al. |
| 2012/0228615 A1 | 9/2012 | Uochi |
| 2012/0286270 A1 | 11/2012 | Isobe et al. |
| 2013/0181214 A1 | 7/2013 | Yamazaki et al. |
| 2015/0311347 A1 | 10/2015 | Yamazaki |
| 2021/0202746 A1 | 7/2021 | Yamazaki |
| 2022/0271170 A1 | 8/2022 | Yamazaki |

FOREIGN PATENT DOCUMENTS

| | | |
|---|---|---|
| EP | 1028469 A | 8/2000 |
| EP | 1737044 A | 12/2006 |
| EP | 2154719 A | 2/2010 |
| EP | 2226847 A | 9/2010 |
| EP | 2428959 A | 3/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-134832 A | 5/1992 |
| JP | 05-251705 A | 9/1993 |
| JP | 06-275697 A | 9/1994 |
| JP | 08-264794 A | 10/1996 |
| JP | 09-022947 A | 1/1997 |
| JP | 09-090416 A | 4/1997 |
| JP | 09-318975 A | 12/1997 |
| JP | 11-017169 A | 1/1999 |
| JP | 11-505377 | 5/1999 |
| JP | 2000-044236 A | 2/2000 |
| JP | 2000-150900 A | 5/2000 |
| JP | 2000-507050 | 6/2000 |
| JP | 2000-216387 A | 8/2000 |
| JP | 2000-299468 A | 10/2000 |
| JP | 2001-274378 A | 10/2001 |
| JP | 2002-033331 A | 1/2002 |
| JP | 2002-050764 A | 2/2002 |
| JP | 2002-076356 A | 3/2002 |
| JP | 2002-289859 A | 10/2002 |
| JP | 2002-329869 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-116973 A | 4/2005 |
| JP | 2005-268724 A | 9/2005 |
| JP | 2006-100842 A | 4/2006 |
| JP | 2006-253440 A | 9/2006 |
| JP | 2007-220816 A | 8/2007 |
| JP | 2008-040343 A | 2/2008 |
| JP | 2008-042088 A | 2/2008 |
| JP | 2008-176262 A | 7/2008 |
| JP | 2008-187084 A | 8/2008 |
| JP | 2008-216940 A | 9/2008 |
| JP | 2009-094492 A | 4/2009 |
| JP | 2009-135350 A | 6/2009 |
| JP | 2009-170794 A | 7/2009 |
| JP | 2009-283749 A | 12/2009 |
| JP | 2010-114413 A | 5/2010 |
| JP | 2010-170110 A | 8/2010 |
| JP | 2010-263064 A | 11/2010 |
| JP | 2011-501877 | 1/2011 |
| JP | 2011-071476 A | 4/2011 |
| JP | 2011-107260 A | 6/2011 |
| JP | 2011-129938 A | 6/2011 |
| JP | 2011-135063 A | 7/2011 |
| JP | 2011-139054 A | 7/2011 |
| JP | 2011-141523 A | 7/2011 |
| JP | 2011-146694 A | 7/2011 |
| JP | 2011-151377 A | 8/2011 |
| JP | 2011-166128 A | 8/2011 |
| JP | 2011-171726 A | 9/2011 |
| JP | 2011-187949 A | 9/2011 |
| JP | 2011-192974 A | 9/2011 |
| JP | 2011-204347 A | 10/2011 |
| JP | 2011-211185 A | 10/2011 |
| JP | 2011-216878 A | 10/2011 |
| JP | 2011-227981 A | 11/2011 |
| JP | 2011-228622 A | 11/2011 |
| JP | 2011-228689 A | 11/2011 |
| JP | 2011-243974 A | 12/2011 |
| JP | 2011-249782 A | 12/2011 |
| JP | 2011-258303 A | 12/2011 |
| JP | 2011-258940 A | 12/2011 |

(56) References Cited

FOREIGN PATENT DOCUMENTS

| | | |
|---|---|---|
| JP | 2012-009837 A | 1/2012 |
| JP | 2012-015499 A | 1/2012 |
| JP | 2012-084851 A | 4/2012 |
| WO | WO-2004/114391 | 12/2004 |
| WO | WO-2009/042144 | 4/2009 |
| WO | WO-2011/046032 | 4/2011 |
| WO | WO-2011/065243 | 6/2011 |
| WO | WO-2011/068066 | 6/2011 |
| WO | WO-2011/074392 | 6/2011 |
| WO | WO-2011/074407 | 6/2011 |
| WO | WO-2011/086847 | 7/2011 |
| WO | WO-2011/089852 | 7/2011 |
| WO | WO-2011/099342 | 8/2011 |
| WO | WO-2011/102217 | 8/2011 |
| WO | WO-2011/108475 | 9/2011 |
| WO | WO-2011/111505 | 9/2011 |
| WO | WO-2011/114867 | 9/2011 |
| WO | WO-2011/114905 | 9/2011 |
| WO | WO-2011/122363 | 10/2011 |
| WO | WO-2011/132529 | 10/2011 |
| WO | WO-2011/135999 | 11/2011 |
| WO | WO-2011/142371 | 11/2011 |
| WO | WO-2011/145634 | 11/2011 |
| WO | WO-2011/152233 | 12/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by AR Plasma Treatment", Appl. Phys. Lett. (Applied Physics Letters) , Jun. 26, 2007, vol. 90, No. 26, p. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch Qvga Amoled Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa. Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:DISTINGUISHED Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTS", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZNO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H, "68.3:Invited Paper: Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YBFE204, and YB2FE307 Types of Structures for Compounds in the IN203 and SC2O3—A2O3—BO Systems [A; Fe, Ga, or Al; B: Mg, Mn, Fe, Ni, Cu, or Zn] At Temperatures Over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

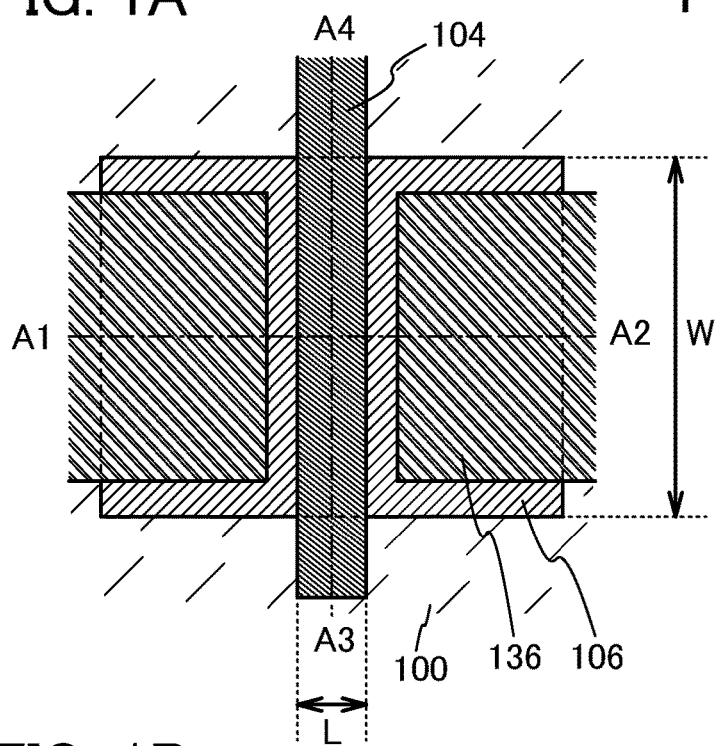
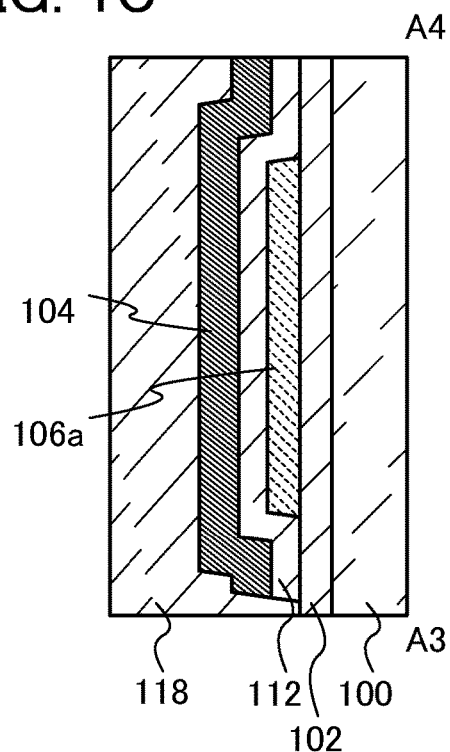
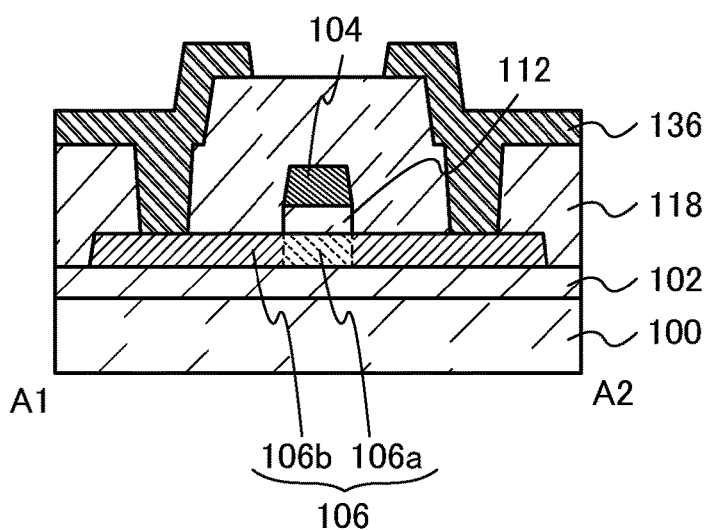

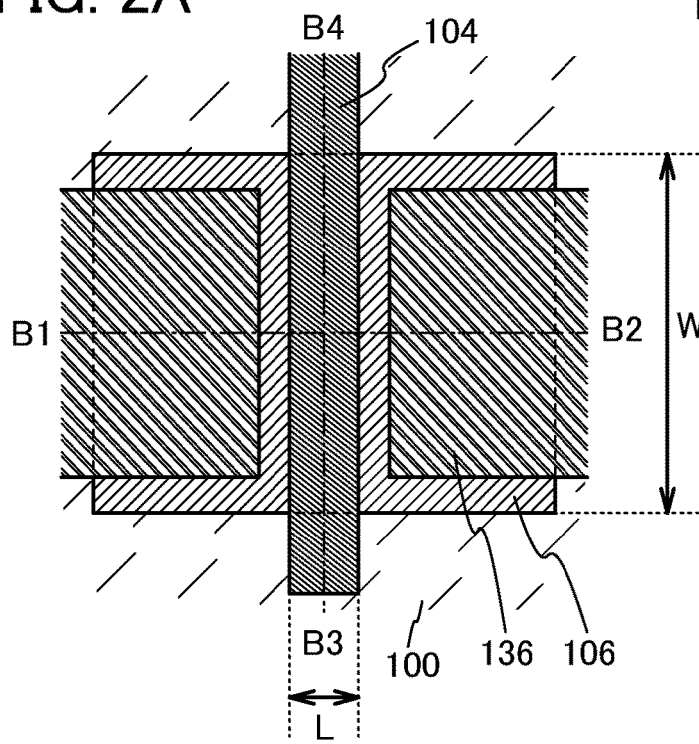
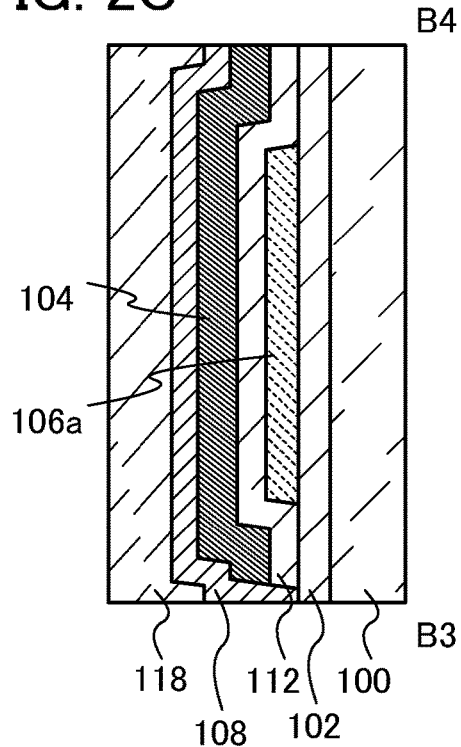
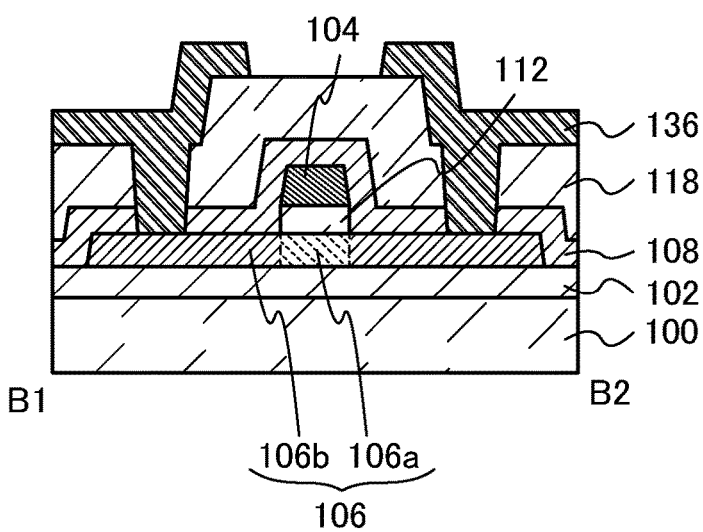

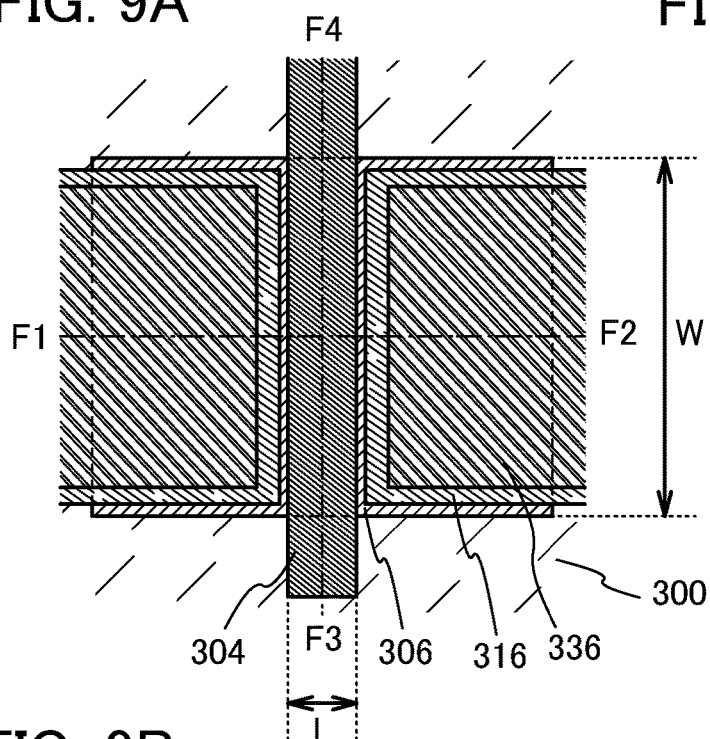
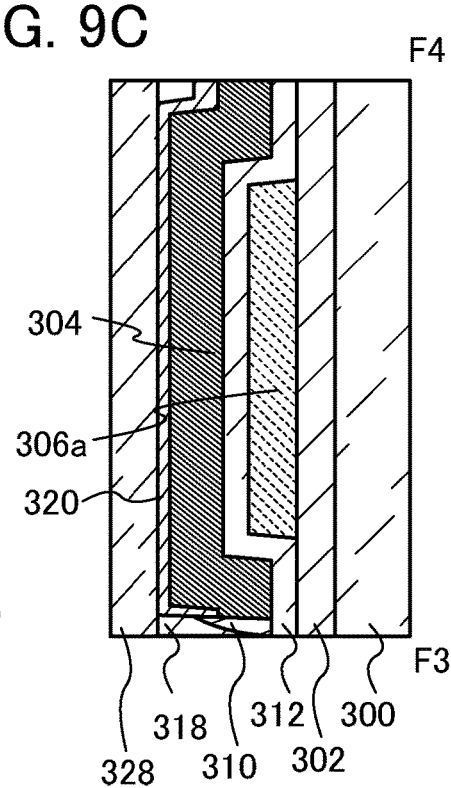
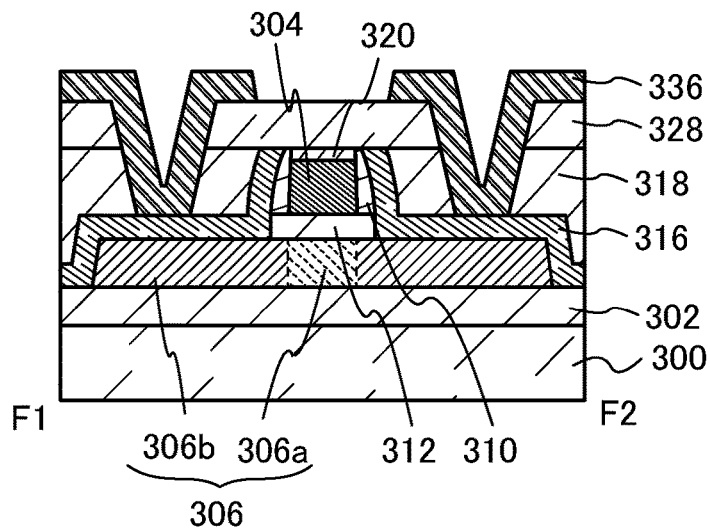
FIG. 9A
FIG. 9B
FIG. 9C

SEMICONDUCTOR DEVICE

BACKGROUND OF THE INVENTION

1. Field of the Invention

The present invention relates to a semiconductor device and a method of manufacturing the semiconductor device.

Note that in this specification, a semiconductor device refers to any device that can function by utilizing semiconductor characteristics, and an electro-optical device, a semiconductor circuit, an electronic device, and the like are all included in the category of semiconductor devices.

2. Description of the Related Art

The integration degree of a semiconductor device including silicon has been increased with miniaturization obeying the scaling law of a transistor or the like, and thus a reduction in power consumption and an improvement in performance have been achieved.

However, in recent years, the limit of the scaling law has become a problem. For example, when the channel length is short, a so-called short-channel effect such as a punch-through phenomenon becomes noticeable.

Further, it is known that a narrow-channel effect is caused when the channel width is small.

In a miniaturized transistor, the threshold voltage cannot be easily controlled due to an influence of a short-channel effect, a narrow-channel effect, or the like, and thus a variation in characteristics easily occurs. In view of this, a design rule for preventing a shift in threshold voltage due to a short-channel effect and a narrow-channel effect has been proposed (see Patent Document 1).

In addition, various methods for reducing a short-channel effect due to miniaturization of a transistor have been examined (see Patent Document 2).

REFERENCE

Patent Documents

[Patent Document 1] Japanese Published Patent Application No. H4-134832
[Patent Document 2] Japanese Published Patent Application No. 2006-100842

SUMMARY OF THE INVENTION

A main object of conventional art is to reduce an influence of a short-channel effect that is a major factor of degradation of electrical characteristics of a transistor accompanying miniaturization, and a transistor in which a short-channel effect is not substantially caused has not been proposed.

An object of one embodiment of the present invention is to provide a transistor in which a short-channel effect is not substantially caused and which has switching characteristics even in the case where the channel length is short.

Another object is to provide a highly integrated semiconductor device including the transistor.

The transistor includes an oxide semiconductor film, in which the channel length is greater than or equal to 5 nm and less than 60 nm and the channel width is greater than or equal to 5 nm and less than 200 nm.

At this time, the channel width is made 0.5 to 10 times as large as the channel length.

The oxide semiconductor film preferably contains at least In.

Alternatively, the oxide semiconductor film preferably contains at least In, Ga, and Zn.

The present inventors have found that a short-channel effect which is caused in a transistor including silicon is not substantially caused in a transistor including an oxide semiconductor film in some cases. This is significantly remarkable. Accordingly, it can be said that a rule for miniaturization which is utterly different from a rule for miniaturization of a transistor obeying the conventional scaling law needs to be established.

As one factor of a punch-through phenomenon which is one kind of short-channel effect caused in a transistor including silicon, drain induced barrier lowering (DIBL) is known.

Hereinafter, it is shown that, with a focus on the curve width of a band in the vicinity of junction portions between an oxide semiconductor film and source and drain electrodes, DIBL caused in a transistor including silicon is not easily caused in a transistor including the oxide semiconductor film.

A band structure between a source and a drain of a transistor including n-type silicon is shown in each of FIGS. 21A and 21B. FIG. 21A is a schematic view of a band structure in the case of a long channel, and FIG. 21B is a schematic view of a band structure in the case of a short channel. Here, the case where the gate voltage ($V_g$) is zero (i.e., the transistor is off) is described.

As shown in each of FIGS. 21A and 21B, the band is curved in the vicinity of a p-n junction interface even when the drain voltage ($V_d$) is zero (shown with a solid line). The reason for this is that carriers are exchanged between $n^+$ regions and a p region so that the Fermi level of the $n^+$ regions and that of the p region are equal to each other, which results in formation of depletion layers having donor ions and acceptor ions and generation of an electric field.

Here, when $V_d$ is applied, the band in the $n^+$ region on the drain side is lowered by $eV_d$ and the depletion layer is extended from the drain side (shown with a dotted line). At this time, in the case of the long channel, $V_d$ does not affect the source side. On the other hand, in the case of the short channel, the depletion layer from the drain side is extended to the source side due to $V_d$, whereby a reduction in the potential of the p region is caused (i.e., bank is made to recede). As a result, current easily flows and the threshold voltage shifts in the negative direction.

Thus, when the channel length of a transistor including n-type silicon is decreased, the width of a depletion layer extended from a drain side, that is, the curve width of a band is increased due to $V_d$. Hereinafter, the curve width of a band in the vicinity of a junction portion between a channel and a source and a drain (p-n junction interface) of each of a transistor including silicon and a transistor including an oxide semiconductor film will be analytically derived.

FIG. 22 shows a band structure on a source side of a transistor including n-type silicon. With reference to FIG. 22, first, the curve width $L_s^{Si}$ of a band on the source side in a p region of the transistor including n-type silicon is obtained. Note that $L_s^{Si}$ is equal to the width of a depletion layer having acceptor ions. Further, $\phi(y)$ represents the potential of a region at a distance of y from a p-n junction interface, and the origin of $\phi(y)$ is the intrinsic level $E_{ipL}^{Si}$ in the p region. Furthermore, $e\phi_F^{Si}$ represents a difference between $E_{ipL}^{Si}$ and a Fermi level $E_F^{Si}$, and is defined as follows: $e\phi_F^{Si} = E_{ipL}^{Si} - E_F^{Si}$. Here, e represents elementary charge. The curve width of the band reflects a spatial variance of φ(y). Formula (1) corresponds to the Poisson equation.

$$\frac{d^2\phi}{dy} = -\frac{\rho}{\varepsilon^{Si}} \quad (1)$$

Note that $\varepsilon^{Si}$ represents a dielectric constant, and p represents a charge density. In the case where attention is focused on the depletion layer in the p region, p may be determined only in consideration of the accepter ions having negative charge, and Formula (2) is obtained.

$$\rho = -eN_A^{Si} \quad (2)$$

Here, $N_A^{Si}$ represents acceptor density. By substituting Formula (2) into Formula (1) and solving it under a boundary condition shown by Formula (3), Formula (4) is obtained.

$$\phi(L_s^{Si}) = \frac{d\phi}{dy}(L_s^{Si}) = 0 \quad (3)$$

$$\phi(y) = \frac{eN_A^{Si}}{2\varepsilon^{Si}} L_s^{Si2} \left(1 - \frac{y}{L_s^{Si}}\right)^2 \quad (4)$$

Here, under a boundary condition shown by Formula (5), $L_s^{Si}$ is obtained as shown in Formula (6).

$$e\phi(0) = \frac{e^2 N_A^{Si}}{2\varepsilon^{Si}} L_s^{Si2} = E_{ipL}^{Si} - E_F^{Si} \equiv e\phi_F^{Si} \quad (5)$$

$$L_s^{Si} = \sqrt{\frac{2\varepsilon^{Si}\phi_F^{Si}}{eN_A^{Si}}} \quad (6)$$

On the other hand, the curve width $L_d^{Si}$ of the band on a drain side at the time of application of $V_d$ is obtained as shown in Formula (7) by a calculation similar to that in the case of $L_s^{Si}$.

$$L_d^{Si} = \sqrt{\frac{2\varepsilon^{Si}(\phi_F^{Si} + V_d)}{eN_A^{Si}}} \quad (7)$$

Formula (7) shows that, in the transistor including silicon, $L_d^{Si}$ is increased due to $V_d$, that is, the depletion layer is extended from the drain side due to $V_d$. The above is a description on DIBL in the transistor including silicon.

Next, FIG. 23 shows a band structure between a source and a drain in a transistor including an oxide semiconductor film. With reference to FIG. 23, the curve width $L_s^{OS}$ of a band on a source side and the curve width $L_d^{OS}$ of the band on a drain side in an oxide semiconductor region in the transistor including the oxide semiconductor film are obtained. Note that, on the assumption that the work function $\phi_m$ of a metal used for the source and the drain is equal to the electron affinity $\chi^{OS}$ of the oxide semiconductor ($\phi_m = \chi^{OS}$), the metal and the oxide semiconductor form an ohmic contact. Further, φ(y) represents the potential of a region at a distance of y from a metal-oxide semiconductor junction interface on the source side. The origin of φ(y) is the intrinsic level $E_{iL}^{OS}$ in the oxide semiconductor region. Furthermore, $e\phi_F^{OS}$ represents a difference between $E_{iL}^{OS}$ and a Fermi level $E_F^{OS}$ on the source side, and is defined as follows: $e\phi_F^{OS} = E_{iL}^{OS} - E_F^{OS}$. In this case, the curve width of the band in the oxide semiconductor region is thought to be derived from the electron density $n^{OS}(y)$ (electrons corresponds to majority carriers), so that the charge density ρ is represented by Formula (8).

$$\rho(y) = -en^{OS}(y) = -en_0^{OS}\text{Exp}\left[\frac{e\phi(y)}{kT}\right] \quad (8)$$

Here, k represents a Boltzmann constant, and T represents an absolute temperature. Note that $n_0^{OS}$ represents the electron density in a bulk region of the oxide semiconductor, and is represented by Formula (9) using an intrinsic carrier density $n_i^{OS}$.

$$n_0^{OS} = n_i^{OS}\text{Exp}\left[-\frac{e\phi_F^{OS}}{kT}\right] \quad (9)$$

Accordingly, φ(y) is obtained using the Poisson equation in Formula (10).

$$\frac{d^2\phi}{dy} = \frac{en_0^{OS}}{\varepsilon^{OS}}\text{Exp}\left[\frac{e\phi}{kT}\right] \quad (10)$$

By solving this under a boundary condition shown by Formula (11), Formula (12) is obtained.

$$\phi(L_s) = \frac{d\phi}{dy}(L_s) = 0 \quad (11)$$

$$\phi(y) = -\frac{2kT}{e}\ln\text{Cos}\left[\sqrt{\frac{e^2 n_0^{OS}}{2\varepsilon^{OS} kT}}(y - L_s^{OS})\right] \quad (12)$$

Accordingly, under a boundary condition shown by Formula (13), Formula (14) is obtained.

$$e\phi(0) = -2kT\ln\text{Cos}\left[\sqrt{\frac{e^2 n_0^{OS}}{2\varepsilon^{OS} kT}} L_s^{OS}\right] = \frac{E_g^{OS}}{2} + e\phi_F^{OS} \quad (13)$$

$$L_s^{OS} = \sqrt{\frac{2\varepsilon^{OS} kT}{e^2 n_0^{OS}}} \text{ArcCos}\left\{Exp\left[-\frac{E_g^{OS}/2 + e\phi_F^{OS}}{2kT}\right]\right\} \quad (14)$$

Here, since $E_g^{OS}/2 + e\phi_F^{OS} \gg 2kT$ is satisfied, Formula (14) can approximate to Formula (15).

$$L_s^{OS} \sim \sqrt{\frac{2\varepsilon^{OS} kT}{e^2 n_0^{OS}}} \text{ArcCos}(0) = \sqrt{\frac{2\varepsilon^{OS} kT}{e^2 n_0^{OS}}} \frac{\pi}{2} = \pi\sqrt{\frac{\varepsilon^{OS} kT}{2e^2 n_0^{OS}}} \quad (15)$$

On the other hand, $L_d^{OS}$ at the time of application of $V_d$ is obtained by substituting $e\phi_F^{OS} + eV_d$ for $e\phi_F^{OS}$ in Formula (13). Also in this case, $E_g^{OS}/2 + e\phi_F^{OS} + eV_d \gg 2kT$ is satisfied, so that Formula (16) is obtained.

$$L_d^{OS} \sim \pi \sqrt{\frac{\varepsilon^{OS} kT}{2e^2 n_0^{OS}}} \sim L_s^{OS} \qquad (16)$$

From the above, in the case of the transistor including the oxide semiconductor film, $L_d^{OS}$ does not depend on $V_d$. Therefore, it can be said that DIBL is not caused in the transistor including the oxide semiconductor film.

A punch-through phenomenon in a transistor including silicon is caused when a depletion layer due to an electric field of a gate is not extended to a deep area of a channel region in some cases. This is because the density of minority carriers in silicon is as high as about $1 \times 10^{11}/cm^3$. That is, by accumulation of the minority carriers, the electric field of the gate does not enter a deep area; thus, the transistor cannot be completely off, which results in an increase in off-state current.

On the other hand, thanks to diligent research by the present inventors, it has become clear that the density of minority carriers in an oxide semiconductor film can be as low as about $1 \times 10^{-9}/cm^3$. That is, in a transistor including an oxide semiconductor film, accumulation of minority carriers hardly occurs, and an electric field of a gate enters a deep area; thus, the transistor can be easily completely off, and thus off-state current can be made small. In this manner, in a transistor including an oxide semiconductor film, a depletion layer is significantly extended due to an electric field of a gate.

As described above, it can be said that a short-channel effect, which is generally known to be caused in a transistor including silicon, is not substantially caused in a transistor including an oxide semiconductor film.

Therefore, it can be said that a transistor including an oxide semiconductor film can easily have switching characteristics even in the case where the channel length is short.

In the case where a transistor including silicon is miniaturized, the channel width is generally decreased when the channel length is decreased.

However, in a transistor including an oxide semiconductor film, in some cases, the threshold voltage shifts in the negative direction when the channel width is decreased as well as the channel length. This fact also has become clear thanks to the diligent research by the present inventors.

Accordingly, it can be said that, in a transistor including an oxide semiconductor film, it is important to make the channel width sufficiently large when the channel length is small in order that the transistor has switching characteristics. Further, it can be said that it is important to keep the ratio of the channel width to the channel length constant for miniaturization.

Here, attention should be paid to the fact that electrons that are carriers are generated due to oxygen vacancies in an oxide semiconductor film.

When electrons are generated in an oxide semiconductor film, a transistor is likely to have so-called normally-on electrical characteristics, that is, the transistor is likely to be on even at a gate voltage of 0 V. Therefore, oxygen vacancies in the oxide semiconductor film are preferably reduced.

For example, in order to reduce oxygen vacancies in the oxide semiconductor film, oxygen supplied from the outside of the oxide semiconductor film may be utilized. As a method of supplying oxygen from the outside, specifically, oxidation treatment such as ion doping treatment, ion implantation treatment, or plasma treatment or the like may be performed. Alternatively, a layer containing excess oxygen may be provided so that oxygen is supplied therefrom to the oxide semiconductor film.

Even with the use of such a method, in some cases, the proportion of oxygen vacancies in the oxide semiconductor film is larger than that of oxygen supplied from the outside in the case where the transistor including the oxide semiconductor film is miniaturized. One reason for this is that the ratio of the surface area to the volume of the oxide semiconductor film is increased with miniaturization. Also in view of this, it can be said that it is important to make the channel width large in the case where the channel length is short.

However, when the channel width is extremely large, miniaturization of the transistor, which is the original object, cannot be achieved. Therefore, the ratio of the channel width to the channel length is determined realistically. From such a reason, there is a possibility that intent to make the channel length small without particular limitation is not practical because the channel width cannot be made larger than a predetermined value.

In view of this, it is important to efficiently utilize oxygen supplied from the outside of the oxide semiconductor film. For example, a layer having low oxygen permeability is provided over the transistor including the oxide semiconductor film, whereby outward diffusion of oxygen is suppressed and thus oxygen can be efficiently utilized. Therefore, even when the channel length is short and the channel width is a predetermined value or smaller, the transistor can have switching characteristics.

Further, in some cases, a parasitic channel is formed on a side surface of the oxide semiconductor film when the transistor including the oxide semiconductor film is miniaturized. This fact also has become clear thanks to the diligent research by the present inventors.

Since an influence of the parasitic channel is noticeable in a transistor having a short channel in some cases, this influence is likely to be regarded as a short channel effect; however, they are different from each other in a strict sense.

The threshold voltage for forming the parasitic channel is generally lower than that for forming the original channel of the transistor. Therefore, when the influence of the parasitic channel becomes large, it seems as if the threshold voltage of the transistor shifts in the negative direction. This is because carriers are easily generated on the side surface of the oxide semiconductor film. For that reason, it is important that the side surface of the oxide semiconductor film be supplied with a larger amount of oxygen than the other surfaces of the oxide semiconductor film.

For example, a layer having low oxygen permeability may be provided on the side surface of the oxide semiconductor film so that oxygen vacancies are not easily generated. Further, a layer containing excess oxygen and the layer having low oxygen permeability may be stacked together to be provided on the side surface of the oxide semiconductor film. At this time, the layer containing excess oxygen is preferably provided in contact with the side surface of the oxide semiconductor film.

It is known that, in the oxide semiconductor film, electrons that are carriers are generated due to hydrogen as well as oxygen vacancies. Therefore, it is preferable that hydrogen in the oxide semiconductor film be also reduced.

The transistor including the oxide semiconductor film in which the density of minority carriers is extremely low and a source of carriers such as oxygen vacancies or hydrogen is reduced has extremely small off-state current.

The transistor including the oxide semiconductor film can be used in combination with a conventional transistor including silicon or the like. For example, in comparison with the transistor including the oxide semiconductor film, a transistor including silicon and a transistor including a compound semiconductor are likely to have improved on-state characteristics. Therefore, the transistor including silicon or the transistor including a compound semiconductor may be used as a transistor for which on-state characteristics are required, and the transistor including the oxide semiconductor film may be used as a transistor for which small off-state current is required. The oxide semiconductor film can be formed by a thin film formation method such as a sputtering method, and thus is not limited so much in combination with another semiconductor material; this is one feature of the oxide semiconductor film.

Note that the transistor including silicon can have excellent electrical characteristics when dangling bonds on a silicon surface are terminated with hydrogen. Therefore, a hydrogen-containing layer serving as a source of hydrogen for the transistor including silicon is preferably provided. However, as described above, hydrogen serves as a source of carriers for the transistor including the oxide semiconductor film, and is a factor of degrading the electrical characteristics of the transistor including the oxide semiconductor film.

Accordingly, in the case where the transistor including silicon and the transistor including the oxide semiconductor film are used in combination, the hydrogen-containing layer is preferably provided closer to the transistor including silicon, and a layer having low hydrogen permeability is preferably provided closer to the transistor including the oxide semiconductor film.

With the use of an oxide semiconductor film, a transistor in which a short-channel effect is not substantially caused and which has switching characteristics even in the case where the channel length is short can be provided.

Further, a highly integrated semiconductor device including the transistor can be provided.

BRIEF DESCRIPTION OF THE DRAWINGS

FIGS. 1A to 1C are a top view and cross-sectional views illustrating an example of a semiconductor device according to one embodiment of the present invention.

FIGS. 2A to 2C are a top view and cross-sectional views illustrating an example of a semiconductor device according to one embodiment of the present invention.

FIGS. 9A to 9C are a top view and cross-sectional views illustrating an example of a semiconductor device according to one embodiment of the present invention.

DETAILED DESCRIPTION OF THE INVENTION

Figure 3A:
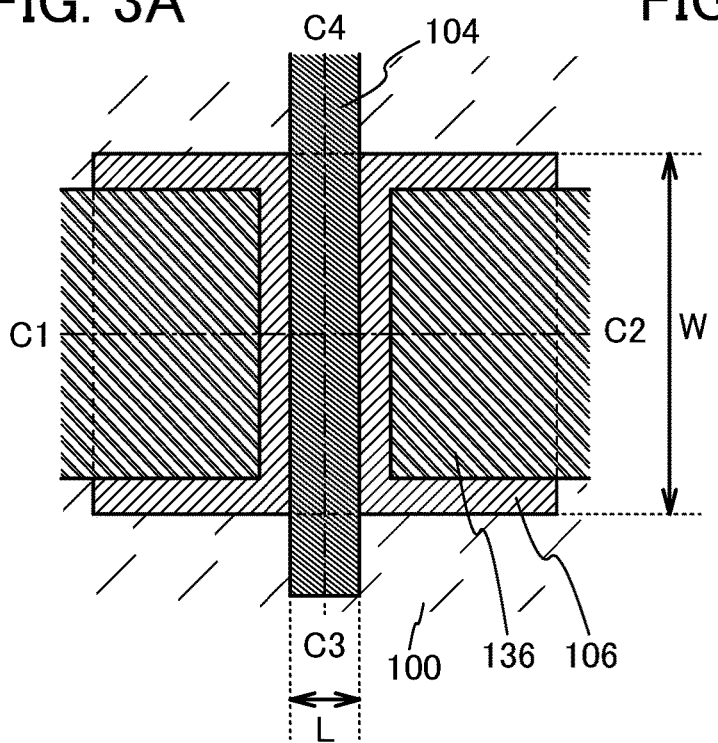
FIGS. 3A to 3C are a top view and cross-sectional views illustrating an example of a semiconductor device according to one embodiment of the present invention.

Embodiments of the present invention will be described in detail with reference to the accompanying drawings. Note that the present invention is not limited to the description below, and it is easily understood by those skilled in the art that modes and details disclosed herein can be modified in various ways. Further, the present invention is not construed as being limited to the description of the embodiments below. In describing structures of the present invention with reference to the drawings, the same reference numerals are used in common for the same portions in different drawings.

The same hatching pattern is applied to similar parts, and the similar parts are not especially denoted by reference numerals in some cases.

The present invention will be described below; terms used in this specification are briefly explained. First, when one of a source and a drain of a transistor is called a drain, the other is called a source in this specification. That is, they are not distinguished depending on the potential level. Therefore, in this specification, a portion called a source can be alternatively referred to as a drain.

Note that a voltage refers to a potential difference between a certain potential and a reference potential (e.g., a ground potential (GND) or a source potential) in many cases. Accordingly, a voltage can also be called a potential.

Further, even when the expression "to be electrically connected" is used in this specification, there is a case in which no physical connection is made and a wiring is just extended in an actual circuit.

Note that the ordinal numbers such as "first" and "second" in this specification are used for convenience and do not denote the order of steps or the stacking order of layers. In addition, the ordinal numbers in this specification do not denote particular names which specify the present invention.

Note that a channel length refers to a distance between a source and a drain of a transistor. The shorter the channel length is, the lower the on-state resistance becomes; thus, a transistor having a short channel length is capable of high-speed operation. Note that a channel width refers to the length of opposite sides of a source and a drain of a transistor. The larger the channel width is, the lower the on-state resistance becomes; thus, a transistor having a large channel width is capable of high-speed operation.

Embodiment 1

In this embodiment, a transistor according to one embodiment of the present invention will be described.

FIG. 1A is a top view of a transistor according to one embodiment of the present invention. FIG. 1B is a cross-sectional view taken along dashed-dotted line A1-A2 in FIG. 1A. FIG. 1C is a cross-sectional view taken along dashed-dotted line A3-A4 in FIG. 1A. Note that a base insulating film 102 and the like are not illustrated in FIG. 1A for simplicity.

In FIG. 1A, the channel length (L) and the channel width (W) of the transistor are shown. Note that the channel region of the transistor corresponds to a region of an oxide semiconductor film 106 overlapping with a gate electrode 104. At least part of two side surfaces of the oxide semiconductor film 106 overlap with the gate electrode 104.

In the transistor illustrated in FIG. 1A, the channel length is greater than or equal to 5 nm and less than 60 nm, and the channel width is greater than or equal to 5 nm and less than 200 nm.

Further, in the transistor illustrated in FIG. 1A, the ratio of the channel width to the channel length is 0.5:1 to 10:1.

FIG. 1B illustrates a cross-sectional structure of the transistor including the base insulating film 102 provided over a substrate 100; the oxide semiconductor film 106 provided over the base insulating film 102; a gate insulating film 112 provided over the oxide semiconductor film 106; and the gate electrode 104 provided over the gate insulating film 112 so as to overlap with the oxide semiconductor film 106.

Note that in FIG. 1B, an interlayer insulating film 118 which is provided over the oxide semiconductor film 106 and the gate electrode 104 and has openings reaching the oxide semiconductor film 106, and wirings 136 provided in contact with the oxide semiconductor film 106 through the openings in the interlayer insulating film 118 are illustrated.

For the oxide semiconductor film 106, for example, an In-M-Zn—O-based material may be used. Here, a metal element M is an element whose bond energy with oxygen is higher than that of In and that of Zn. Alternatively, the metal element M is an element which has a function of suppressing desorption of oxygen from the In-M-Zn—O-based material. Owing to the effect of the metal element M, generation of oxygen vacancies in the oxide semiconductor film is suppressed to some extent. It is thus possible to reduce variation in the electrical characteristics of the transistor which is caused by oxygen vacancies, so that a highly reliable transistor can be obtained.

Specifically, the metal element M may be Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or HF. For the metal element M, one or more elements may be selected from the above elements. Further, Si or Ge may be used instead of the metal element M.

Note that generation of oxygen vacancies in the oxide semiconductor film 106 cannot be completely suppressed only by the action of the metal element M in the oxide semiconductor film 106. Therefore, it is important that oxygen be supplied from at least one of the base insulating film 102 and the gate insulating film 112.

The hydrogen concentration in the oxide semiconductor film 106 is $2\times10^{20}$ atoms/cm$^3$ or lower, preferably $5\times10^{19}$ atoms/cm$^3$ or lower, more preferably $1\times10^{19}$ atoms/cm$^3$ or lower. This is because hydrogen in the oxide semiconductor film 106 generates unintentional carriers in some cases. The generated carriers are a factor of changing electrical characteristics of the transistor.

The oxide semiconductor film 106 is in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in carrier mobility, due to the grain boundary, is suppressed.

In each of the crystal parts included in the CAAC-OS film, a c-axis is aligned in a direction perpendicular to a surface where the CAAC-OS film is formed or a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°.

In the CAAC-OS film, distribution of crystal parts is not necessarily uniform. For example, in the formation process of the CAAC-OS film, in the case where crystal growth occurs from a top surface side of the oxide semiconductor film 106, the proportion of crystal parts on the top surface of the oxide semiconductor film is sometimes higher than that on the surface where the oxide semiconductor film is formed. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). Note that the direction of c-axis of the crystal part is the direction parallel to a normal vector of the surface where the CAAC-OS film is formed just after the formation of the CAAC-OS film or a normal vector of the top surface of the CAAC-OS film just after the formation of the CAAC-OS film. The crystal part is formed by film formation or by performing treatment for crystallization such as heat treatment after film formation.

With the use of the CAAC-OS film in a transistor, a change in electric characteristics of the transistor due to irradiation with visible light or ultraviolet light is small. Thus, the transistor has high reliability.

Note that the oxide semiconductor film 106 includes a region 106a and regions 106b. The region 106a functions as a channel region, and the regions 106b function as a source region and a drain region. Therefore, in some cases, the regions 106b should be called not a semiconductor but a conductor. For that reason, even when the expression "oxide semiconductor film 106" is used for simplicity, this means only the region 106a and does not include the regions 106b in some cases.

The regions 106b have lower resistance than the region 106a. The regions 106b contain an impurity having a function of reducing the resistance of the oxide semiconductor film. Examples of the impurity having a function of reducing the resistance of the oxide semiconductor film include helium, boron, nitrogen, fluorine, neon, aluminum, phosphorus, argon, arsenic, krypton, indium, tin, antimony, and xenon.

In the region 106a of the oxide semiconductor film 106, the band gap is approximately 2.8 eV to 3.2 eV, the density of minority carriers is as extremely low as approximately $10^{-9}/cm^3$, and majority carriers flow only from the source of the transistor.

The oxide semiconductor film 106 has a wider band gap than silicon by approximately 1 eV to 2 eV. For that reason, in the transistor including the oxide semiconductor film 106, impact ionization is unlikely to occur and avalanche breakdown is unlikely to occur. That is, it can be said that, in the transistor including the oxide semiconductor film 106, hot-carrier degradation is unlikely to occur.

In the region 106a, the impurity concentration is low and oxygen vacancies are not easily generated. Therefore, in the transistor including the oxide semiconductor film 106, the region 106a can be completely depleted by an electric field of the gate electrode 104 even in the case where the thickness of the oxide semiconductor film 106 is large (for example, greater than or equal to 15 nm and less than 100 nm). For that reason, in the transistor including the oxide semiconductor film 106, a shift of the threshold voltage in the negative direction due to a puch-through phenomenon is not caused and, when the channel length is, for example, 3 µm, the off-state current can be lower than $10^{-21}$ A or lower than $10^{-24}$ A per micrometer of channel width at room temperature.

The oxide semiconductor film with few oxygen vacancies does not have a signal due to oxygen vacancies, which can be evaluated by electron spin resonance (ESR). Specifically, the spin density attributed to oxygen vacancies of the oxide semiconductor film is lower than $5 \times 10^{16}$ spins/cm$^3$. When the oxide semiconductor film has oxygen vacancies, a signal having symmetry is found at a g value of around 1.93 in ESR.

It is preferable that the base insulating film 102 be sufficiently flat. Specifically, the base insulating film 102 has an average surface roughness ($R_a$) of 1 nm or less, preferably 0.3 nm or less, further preferably 0.1 nm or less. When $R_a$ is less than or equal to the above value, the oxide semiconductor film 106 can have high crystallinity. Further, when the degree of roughness at the interface between the base insulating film 102 and the oxide semiconductor film 106 is small, the influence of interface scattering can be reduced. Note that $R_a$ is obtained by expanding arithmetic mean surface roughness, which is defined by JIS B 0601: 2001 (ISO4287: 1997), into three dimensions so as to be applied to a curved surface. In addition, $R_a$ can be expressed as "an average value of the absolute values of deviations from a reference surface to a specific surface" and is defined by Formula (17).

$$Ra = \frac{1}{S_0} \int_{y1}^{y2} \int_{x1}^{x2} |f(x, y) - Z_0| dx dy \qquad (17)$$

Here, the specific surface is a surface which is a target of roughness measurement, and is a quadrilateral region which is specified by four points represented by the coordinates $(x_1, y_1, f(x_1, y_1))$, $(X_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Further, $R_a$ can be measured using an atomic force microscope (AFM).

The base insulating film 102 is preferably an insulating film containing excess oxygen.

An insulating film containing excess oxygen refers to an insulating film in which the amount of released oxygen which is converted into oxygen atoms is greater than or equal to $1 \times 10^{18}$ atoms/cm$^3$, greater than or equal to $1 \times 10^{19}$ atoms/cm$^3$, or greater than or equal to $1 \times 10^{20}$ atoms/cm$^3$ in thermal desorption spectroscopy (TDS).

Here, a method for measuring the amount of released oxygen using TDS will be described.

The total amount of released gas in TDS is proportional to the integral value of the ion intensity of the released gas. Then, this integral value is compared with the reference value of a standard sample, whereby the total amount of the released gas can be calculated.

For example, the number of released oxygen molecules ($N_{O2}$) from an insulating film can be calculated according to Formula (18) using the TDS results of a silicon wafer containing hydrogen at a predetermined density, which is the standard sample, and the TDS results of the insulating film. Here, all gasses having a mass number of 32 which are obtained by the TDS are assumed to originate from an oxygen molecule. $CH_3OH$ can be given as a gas having a mass number of 32, but is not taken into consideration on the assumption that CH$_3$OH is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \qquad (18)$$

$N_{H2}$ is the value obtained by conversion of the number of hydrogen molecules desorbed from the standard sample into density. $S_{H2}$ is the integral value of ion intensity when the standard sample is analyzed by TDS. Here, the reference value of the standard sample is expressed by $N_{H2}/S_{H2}$. $S_{O2}$ is the integral value of ion intensity when the insulating film is analyzed by TDS, and a is a coefficient affecting the ion intensity in the TDS. For details of Formula (18), Japanese Published Patent Application No. H6-275697 is referred to. Note that the amount of released oxygen from the insulating film was measured with a thermal desorption spectroscopy apparatus produced by ESCO Ltd., EMD-WA1000S/W using a silicon wafer containing hydrogen atoms at 1×10$^{16}$ atoms/cm$^3$ as the standard sample.

Further, in the TDS, oxygen is partly detected as an oxygen atom. The ratio between oxygen molecules and oxygen atoms can be calculated from the ionization rate of oxygen molecules. Note that, since the above a is determined considering the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

The insulating film containing excess oxygen may contain a peroxide radical. Specifically, the spin density attributed to a peroxide radical of the insulating film is 5×10$^{17}$ spins/cm$^3$ or higher. Note that the insulating film containing a peroxide radical has a signal having asymmetry at a g value of around 2.01 in ESR.

The insulating film containing excess oxygen may be formed using oxygen-excess silicon oxygen (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by Rutherford backscattering spectrometry.

The base insulating film 102 may be formed of a single layer or a stacked layer using one or more of the following materials: aluminum oxide, aluminum nitride, magnesium oxide, silicon oxide, silicon oxynitride, germanium oxide, yttrium oxide, zirconium oxide, lanthanum oxide, neodymium oxide, hafnium oxide, and tantalum oxide. In addition to the single layer or the stacked layer, silicon nitride oxide or silicon nitride may be stacked.

The amount of oxygen is larger than that of nitrogen in silicon oxynitride, and the amount of nitrogen is larger than that of oxygen in silicon nitride oxide.

The gate insulating film 112 is preferably an insulating film containing excess oxygen.

The gate insulating film 112 may be formed of a single layer or a stacked layer using one or more of the following materials: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

"Excess oxygen" contained in at least one of the base insulating film 102 and the gate insulating film 112 means that the oxygen content is in excess of that in the stoichiometric composition. Therefore, "excess oxygen" is released when energy such as heat is applied to the film. Since "excess oxygen" means that the oxygen content is in excess of that in the stoichiometric composition, the film quality is not impaired even when "excess oxygen" is released from the film.

For example, the oxygen vacancies in the oxide semiconductor film 106 can be reduced by oxygen supplied from at least one of the base insulating film 102 and the gate insulating film 112. That is, when the oxygen vacancies in the oxide semiconductor film 106 are reduced, a shift of the threshold voltage of the transistor in the negative direction can be prevented. For that purpose, at least one of the base insulating film and the gate insulating film may be an insulating film containing excess oxygen.

Note that when heat treatment is performed in the state where the oxide semiconductor film 106 is interposed between the base insulating film 102 and the gate insulating film 112, oxygen released from the base insulating film 102 can be efficiently supplied to the oxide semiconductor film 106. By performing the heat treatment at a temperature higher than or equal to 250° C. and lower than or equal to 550° C., oxygen can be supplied to the oxide semiconductor film 106, and in addition, the hydrogen concentration in the oxide semiconductor film 106, that in the base insulating film 102, and that in the gate insulating film 112 can be reduced.

However, excess oxygen contained in at least one of the base insulating film 102 and the gate insulating film 112 might be lost through the heat treatment in some cases. In order to reduce a change in electrical characteristics of the transistor, at least one of the base insulating film 102 and the gate insulating film 112 preferably contains excess oxygen even after the heat treatment is performed.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate which is unlikely to shrink through the heat treatment is preferably used. For example, a large-sized glass substrate which has a shrinkage of 10 ppm or less, preferably 5 ppm or less, more preferably 3 ppm or less after heat treatment at 400° C., preferably at 450° C., more preferably 500° C. for one hour may be used as the substrate 100.

Further alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The gate electrode 104 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The interlayer insulating film 118 may be formed of a single layer or a stacked layer using one or more materials containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

It is preferable that the interlayer insulating film 118 have low relative permittivity and a sufficient thickness. For example, a silicon oxide film having a relative permittivity of approximately 3.8 and a thickness greater than or equal to 200 nm and less than or equal to 1000 nm may be provided. A top surface of the interlayer insulating film 118 has a little fixed charge because of the influence of atmospheric components and the like, which might cause the shift of the threshold voltage of the transistor. Therefore, it is preferable that the interlayer insulating film 118 have relative permittivity and a thickness such that the influence of the charge at the top surface is sufficiently reduced. For the same reason, a resin film of a polyimide resin, an acrylic resin, an epoxy resin, a silicone resin, or the like may be formed over the interlayer insulating film 118 in order to reduce the influence of the charge at the top surface of the interlayer insulating film 118.

The wirings 136 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

A transistor having a structure different from that of the transistor illustrated in FIGS. 1A to 1C will be described with reference to FIGS. 2A to 2C.

FIG. 2A is a top view of a transistor according to one embodiment of the present invention. FIG. 2B is a cross-sectional view taken along dashed-dotted line B1-B2 in FIG. 2A. FIG. 2C is a cross-sectional view taken along dashed-dotted line B3-B4 in FIG. 2A. Note that the base insulating film 102 and the like are not illustrated in FIG. 2A for simplicity.

In FIG. 2A, the channel length (L) and the channel width (W) of the transistor are shown. Note that the channel region of the transistor corresponds to a region of the oxide semiconductor film 106 overlapping with the gate electrode 104. At least part of two side surfaces of the oxide semiconductor film 106 overlap with the gate electrode 104.

In the transistor illustrated in FIG. 2A, the channel length is greater than or equal to 5 nm and less than 60 nm, and the channel width is greater than or equal to 5 nm and less than 200 nm.

Further, in the transistor illustrated in FIG. 2A, the ratio of the channel width to the channel length is 0.5:1 to 10:1.

FIG. 2B illustrates a cross-sectional structure of the transistor including the base insulating film 102 provided over the substrate 100; the oxide semiconductor film 106 provided over the base insulating film 102; the gate insulating film 112 provided over the oxide semiconductor film 106; the gate electrode 104 provided over the gate insulating film 112 so as to overlap with the oxide semiconductor film 106; and a barrier film 108 which is provided over the base insulating film 102, the oxide semiconductor film 106, and the gate electrode 104 and has openings reaching the oxide semiconductor film 106.

Note that in FIG. 2B, the interlayer insulating film 118 which is provided over the oxide semiconductor film 106 and the gate electrode 104 and has openings reaching the oxide semiconductor film 106, and the wirings 136 provided in contact with the oxide semiconductor film 106 through the openings in the interlayer insulating film 118 are illustrated.

The transistor in FIGS. 2A to 2C is different from the transistor in FIGS. 1A to 1C only in the presence of the barrier film 108 which is provided over the base insulating film 102, the oxide semiconductor film 106, and the gate electrode 104 and has the openings reaching the oxide semiconductor film 106. Therefore, for structures of the other components, the description with reference to FIGS. 1A to 1C can be referred to.

The barrier film 108 is an insulating film having low oxygen permeability. Specifically, the barrier film 108 is an insulating film through which oxygen does not pass even when heat treatment is performed at 350° C. for one hour.

The barrier film 108 may be formed of a single layer or a stacked layer using one or more of the following materials: aluminum oxide, aluminum nitride, magnesium oxide, germanium oxide, yttrium oxide, zirconium oxide, lanthanum oxide, neodymium oxide, hafnium oxide, and tantalum oxide. In particular, an aluminum oxide film is preferably used.

In the transistor in FIGS. 2A to 2C, outward diffusion of excess oxygen contained in the base insulating film 102 or the gate insulating film 112 can be prevented because of the barrier film 108 which is provided over the base insulating film 102, the oxide semiconductor film 106, and the gate electrode 104 and has the openings reaching the oxide semiconductor film 106. Therefore, excess oxygen contained in the base insulating film 102 or the gate insulating film 112 can be efficiently supplied to the oxide semiconductor film 106. That is, a shift of the threshold voltage of the transistor in the negative direction can be further suppressed in comparison with the transistor in FIGS. 1A to 1C.

A transistor having a structure different from those of the transistors illustrated in FIGS. 1A to 1C and FIGS. 2A to 2C will be described with reference to FIGS. 3A to 3C.

FIG. 3A is a top view of a transistor according to one embodiment of the present invention. FIG. 3B is a cross-sectional view taken along dashed-dotted line C1-C2 in FIG. 3A. FIG. 3C is a cross-sectional view taken along dashed-dotted line C3-C4 in FIG. 3A. Note that the base insulating film 102 and the like are not illustrated in FIG. 3A for simplicity.

In FIG. 3A, the channel length (L) and the channel width (W) of the transistor are shown. Note that the channel region of the transistor corresponds to a region of the oxide semiconductor film 106 overlapping with the gate electrode 104. At least part of two side surfaces of the oxide semiconductor film 106 overlap with the gate electrode 104.

In the transistor illustrated in FIG. 3A, the channel length is greater than or equal to 5 nm and less than 60 nm, and the channel width is greater than or equal to 5 nm and less than 200 nm.

Further, in the transistor illustrated in FIG. 3A, the ratio of the channel width to the channel length is 0.5:1 to 10:1.

Figure 3C:
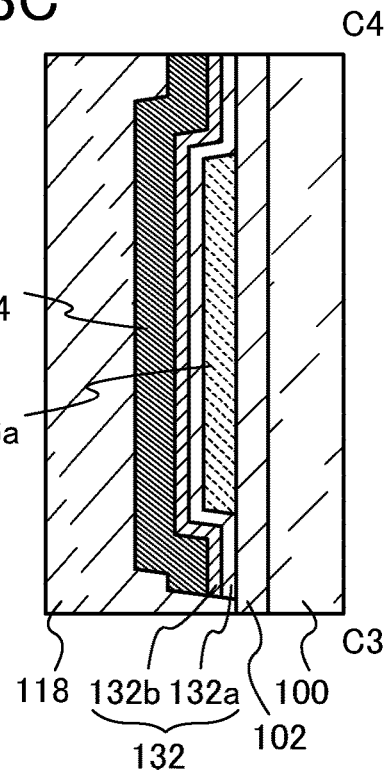
Figure 3B:
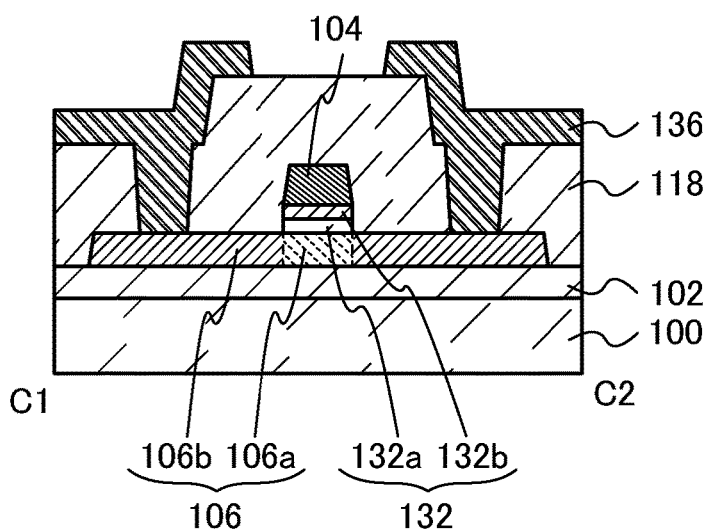

FIG. 3B illustrates a cross-sectional structure of the transistor including the base insulating film 102 provided over the substrate 100; the oxide semiconductor film 106 provided over the base insulating film 102; a gate insulating film 132 which is provided over the oxide semiconductor film 106 and includes a first layer 132a and a second layer 132b; and the gate electrode 104 provided over the gate insulating film 132 so as to overlap with the oxide semiconductor film 106. Note that the first layer 132a is closer to the oxide semiconductor film 106 than the second layer 132b.

Note that in FIG. 3B, the interlayer insulating film 118 which is provided over the oxide semiconductor film 106 and the gate electrode 104 and has openings reaching the oxide semiconductor film 106, and the wirings 136 provided in contact with the oxide semiconductor film 106 through the openings in the interlayer insulating film 118 are illustrated.

The transistor in FIGS. 3A to 3C is different from the transistor in FIGS. 1A to 1C only in that the gate insulating film 132 including the first layer 132a and the second layer 132b is provided instead of the gate insulating film 112. Therefore, for structures of the other components, the description with reference to FIGS. 1A to 1C can be referred to.

Here, the first layer 132a is formed using an insulating film containing excess oxygen.

The first layer 132a may be formed of a single layer or a stacked layer using one or more of the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The second layer 132b is formed using an insulating film having low oxygen permeability. Specifically, an insulating film through which oxygen does not pass even when heat treatment is performed at 350° C. for one hour is used.

The second layer 132b may be formed of a single layer or a stacked layer using one or more of the following materials: aluminum oxide, aluminum nitride, magnesium oxide, germanium oxide, yttrium oxide, zirconium oxide, lanthanum oxide, neodymium oxide, hafnium oxide, and tantalum oxide. In particular, an aluminum oxide film is preferably used.

As illustrated in FIG. 3C, the first layer 132a is provided in contact with parts of the side surfaces of the oxide semiconductor film 106 overlapping with the gate electrode 104. Therefore, oxygen can be supplied from the first layer 132a to the side surfaces of the oxide semiconductor film 106 overlapping with the gate electrode 104. Since the second layer 132b is provided so as to cover the first layer 132a, oxygen can be efficiently supplied from the first layer 132a.

A parasitic channel is formed on the side surfaces of the oxide semiconductor film depending on the properties of the side surfaces of the oxide semiconductor film. The threshold voltage for forming the parasitic channel is generally lower than that for forming the original channel of the transistor. Therefore, when the influence of the parasitic channel becomes large, it seems as if the threshold voltage of the transistor shifts in the negative direction. This is because carriers are easily generated on the side surfaces of the oxide semiconductor film. For that reason, it is important that the side surfaces of the oxide semiconductor film be supplied with a larger amount of oxygen than the other surfaces of the oxide semiconductor film.

The influence of the parasitic channel becomes noticeable in a short-channel transistor in some cases; thus, the structure illustrated in FIGS. 3A to 3C is effective for a miniaturized transistor.

In the transistor in FIGS. 3A to 3C, the parasitic channel is unlikely to be formed on the side surfaces of the oxide semiconductor film 106 overlapping with the gate electrode 104. That is, a shift of the threshold voltage of the transistor in the negative direction can be further suppressed in comparison with the transistor in FIGS. 1A to 1C.

A transistor having a structure different from those of the transistors illustrated in FIGS. 1A to 1C, FIGS. 2A to 2C, and FIGS. 3A to 3C will be described with reference to FIGS. 4A to 4C.

Figure 4A:
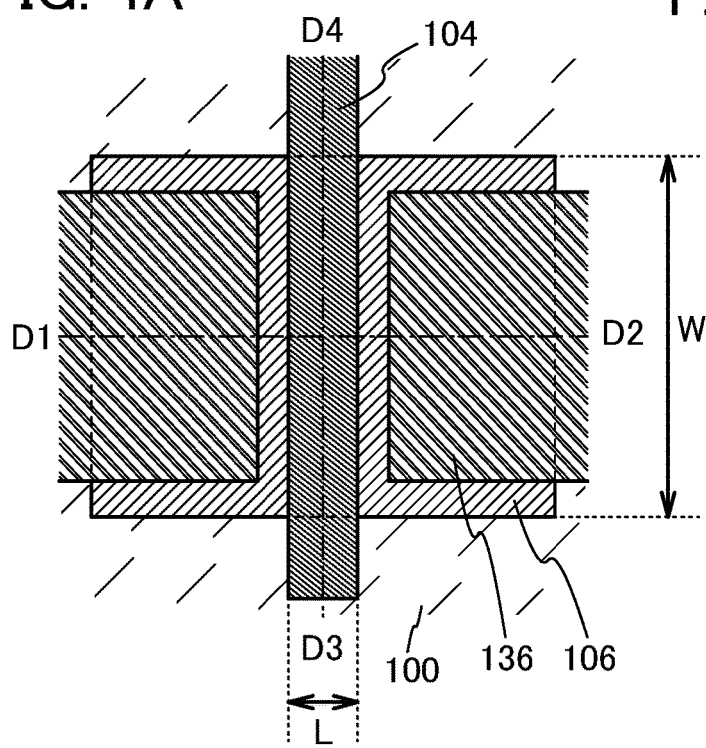
FIGS. 4A to 4C are a top view and cross-sectional views illustrating an example of a semiconductor device according to one embodiment of the present invention.

FIG. 4A is a top view of a transistor according to one embodiment of the present invention. FIG. 4B is a cross-sectional view taken along dashed-dotted line D1-D2 in FIG. 4A. FIG. 4C is a cross-sectional view taken along dashed-dotted line D3-D4 in FIG. 4A. Note that the base insulating film 102 and the like are not illustrated in FIG. 4A for simplicity.

In FIG. 4A, the channel length (L) and the channel width (W) of the transistor are shown. Note that the channel region of the transistor corresponds to a region of the oxide semiconductor film 106 overlapping with the gate electrode 104. At least part of two side surfaces of the oxide semiconductor film 106 overlap with the gate electrode 104.

In the transistor illustrated in FIG. 4A, the channel length is greater than or equal to 5 nm and less than 60 nm, and the channel width is greater than or equal to 5 nm and less than 200 nm.

Further, in the transistor illustrated in FIG. 4A, the ratio of the channel width to the channel length is 0.5:1 to 10:1.

Figure 4C:
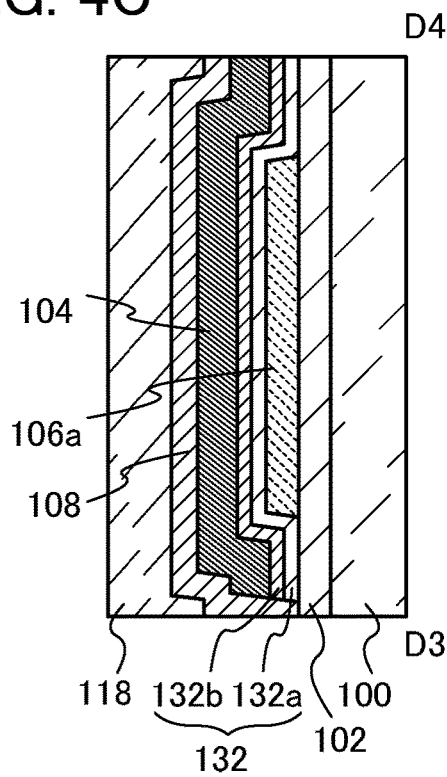
Figure 4B:
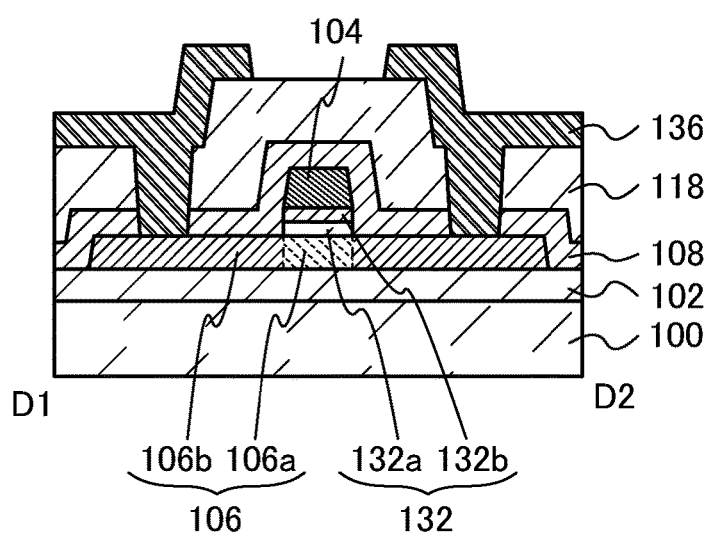

FIG. 4B illustrates a cross-sectional structure of the transistor including the base insulating film 102 provided over the substrate 100; the oxide semiconductor film 106 provided over the base insulating film 102; the gate insulating film 132 which is provided over the oxide semiconductor film 106 and includes the first layer 132a and the second layer 132b; the gate electrode 104 provided over the gate insulating film 132 so as to overlap with the oxide semiconductor film 106; and the bather film 108 which is provided over the base insulating film 102, the oxide semiconductor film 106, and the gate electrode 104 and has openings reaching the oxide semiconductor film 106. Note that the first layer 132a is closer to the oxide semiconductor film 106 than the second layer 132b.

Note that in FIG. 4B, the interlayer insulating film 118 which is provided over the oxide semiconductor film 106 and the gate electrode 104 and has openings reaching the oxide semiconductor film 106, and the wirings 136 provided in contact with the oxide semiconductor film 106 through the openings in the interlayer insulating film 118 are illustrated.

The transistor in FIGS. 4A to 4C is the same as the transistor in FIGS. 2A to 2C in the presence of the barrier film 108 which is provided over the base insulating film 102, the oxide semiconductor film 106, and the gate electrode 104 and has the openings reaching the oxide semiconductor film 106. Further, the transistor in FIGS. 4A to 4C is the same as the transistor in FIGS. 3A to 3C in that the gate insulating film 132 including the first layer 132a and the second layer 132b is provided instead of the gate insulating film 112. Therefore, for the structure of the transistor in FIGS. 4A to 4C, the description with reference to FIGS. 1A to 1C, FIGS. 2A to 2C, and FIGS. 3A to 3C can be referred to.

In the transistor in FIGS. 4A to 4C, outward diffusion of excess oxygen contained in the base insulating film 102 or the first layer 132a can be prevented because of the barrier film 108 which is provided over the base insulating film 102, the oxide semiconductor film 106, and the gate electrode 104 and has the openings reaching the oxide semiconductor film 106. Therefore, excess oxygen contained in the base insulating film 102 or the first layer 132a can be efficiently supplied to the oxide semiconductor film 106. That is, a shift of the threshold voltage of the transistor in the negative direction can be suppressed.

As illustrated in FIG. 4C, the first layer 132a is provided in contact with parts of the side surfaces of the oxide semiconductor film 106 overlapping with the gate electrode 104. Therefore, oxygen can be supplied from the first layer 132a to the side surfaces of the oxide semiconductor film 106 overlapping with the gate electrode 104. Since the second layer 132b is provided so as to cover the first layer 132a, oxygen can be efficiently supplied from the first layer 132a.

Therefore, in the transistor in FIGS. 4A to 4C, the parasitic channel is unlikely to be formed on the side surfaces of the oxide semiconductor film 106 overlapping with the gate electrode 104. That is, a shift of the threshold voltage of the transistor in the negative direction can be suppressed.

From the above, a transistor including an oxide semiconductor film with a large channel width (greater than or equal to 5 nm and less than 200 nm) is proposed as a transistor in which a short-channel effect is not substantially caused even when the channel length is short (greater than or equal to 5 nm and less than 60 nm).

Further, a transistor including an oxide semiconductor film having a constant ratio of a channel width to a channel length is proposed.

Furthermore, a transistor in which a shift of the threshold voltage in the negative direction due to oxygen vacancies in the oxide semiconductor film 106 and a shift of the threshold voltage in the negative direction due to a parasitic channel are suppressed is proposed.

From the above, a transistor that can have switching characteristics even when miniaturized can be provided.

A method of manufacturing the transistor in FIGS. 4A to 4C will be described below with reference to FIGS. 5A to 5C and FIGS. 6A to 6C. Note that the method of manufacturing the transistor in FIGS. 4A to 4C may be employed as appropriate for methods of manufacturing the transistors in FIGS. 1A to 1C, FIGS. 2A to 2C, and FIGS. 3A to 3C. Here, only cross-sectional views corresponding to FIG. 4B are illustrated for simplicity.

First, the substrate 100 is prepared.

Figure 5A:
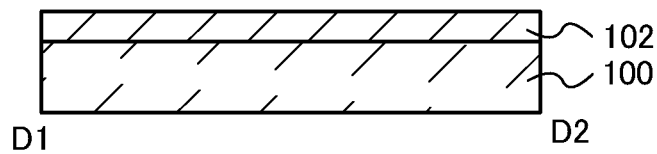
FIGS. 5A to 5C are cross-sectional views illustrating an example of a method of manufacturing the semiconductor device according to one embodiment of the present invention.

Next, the base insulating film 102 is formed over the substrate 100 (see FIG. 5A). The base insulating film 102 may be formed using any of the above materials for the base insulating film 102 by a sputtering method, a chemical vapor deposition (CVD) method, a molecular beam epitaxy (MBE) method, an atomic layer deposition (ALD) method, or a pulsed laser deposition (PLD) method.

Here, the base insulating film 102 may be subjected to dehydration or dehydrogenation treatment. For example, heat treatment can be performed as the dehydration or dehydrogenation treatment. The heat treatment may be performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidizing gas at 10 ppm or more, preferably 1% or more, more preferably 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, preferably 1% or more, more preferably 10% or more in order to compensate desorbed oxygen. Alternatively, as the dehydration or dehydrogenation treatment, plasma treatment, UV treatment, or chemical treatment may be performed.

Then, oxygen may be added to the base insulating film 102 from the upper surface side of the base insulating film 102. The addition of oxygen may be performed by an ion implantation method or an ion doping method. In that case, the acceleration voltage is made higher than or equal to 5 kV and lower than or equal to 100 kV. The amount of added oxygen is made greater than or equal to $1 \times 10^{14}$ ions/cm$^2$ and less than or equal to $1 \times 10^{16}$ ions/cm$^2$. Note that oxygen may be further added to the base insulating film 102 from the upper surface side of the base insulating film 102 under a different condition.

Alternatively, the addition of oxygen may be performed by application of a bias voltage to the substrate side in plasma containing oxygen. In that case, the bias voltage is made higher than or equal to 10 V and lower than 1 kV. The application time of the bias voltage is made longer than or equal to 10 s and shorter than or equal to 1000 s, preferably longer than or equal to 10 s and shorter than or equal to 200 s, more preferably longer than or equal to 10 s and shorter than or equal to 60 s. The higher the bias voltage is and the longer the application time of the bias voltage is, the larger the amount of added oxygen becomes; however, etching of the film accompanying the application of the bias voltage becomes non-negligible.

By the addition of oxygen, the base insulating film 102 can be an insulating film containing excess oxygen. Note that the formation method of the insulating film containing excess oxygen is not limited to the above. For example, the insulating film containing excess oxygen can be formed also by a sputtering method under an atmosphere containing a high proportion of oxygen with the substrate temperature higher than or equal to room temperature (approximately 25° C.) and lower than or equal to 150° C. Specifically, the proportion of an oxidizing gas such as oxygen in a deposition gas may be set to 20% or higher, preferably 50% or higher, more preferably 80% or higher. The formation methods of the insulating film containing excess oxygen may be combined as appropriate.

The base insulating film 102 containing excess oxygen may be formed in the above manner. Note that this embodiment is not limited to the case where the base insulating film 102 contains excess oxygen.

Since the base insulating film 102 preferably has sufficient planarity, the base insulating film 102 may be subjected to planarization treatment. As the planarization treatment, chemical mechanical polishing (CMP) or a dry etching method may be used. Specifically, the base insulating film 102 is provided so as to have an average surface roughness ($R_a$) of 1 nm or less, preferably 0.3 nm or less, more preferably 0.1 nm or less.

Next, an oxide semiconductor film is formed. The oxide semiconductor film may be formed using any of the above materials for the oxide semiconductor film 106 by a sputtering method, a CVD method, an MBE method, an ALD method, or a PLD method. The oxide semiconductor film is preferably formed by a sputtering method. At this time, a deposition gas which includes an oxidizing gas such as oxygen at 5% or more, preferably 10% or more, further preferably 20% or more, still further preferably 50% or more is used. As the deposition gas, a gas in which the concentration of impurities such as hydrogen is low is used.

After the oxide semiconductor film is formed, first heat treatment may be performed. The first heat treatment may be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, impurities such as hydrogen and water can be removed from the oxide semiconductor film.

Figure 5B:
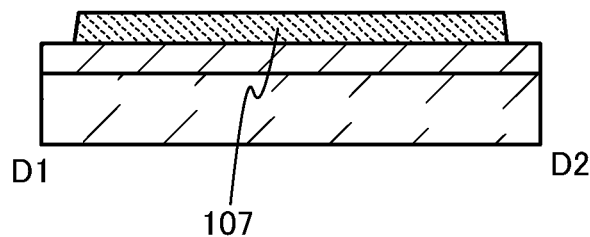

Next, the oxide semiconductor film is processed to form an island-shaped oxide semiconductor film 107 (see FIG. 5B).

Then, a first layer 133a is formed. The first layer 133a may be formed using any of the above materials for the first layer 132a by a sputtering method, a CVD method, an MBE method, an ALD method, or a PLD method.

Here, the first layer 133a may be subjected to dehydration or dehydrogenation treatment. For example, heat treatment can be performed as the dehydration or dehydrogenation treatment. The heat treatment may be performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidizing gas at 10 ppm or more, preferably 1% or more, more preferably 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, preferably 1% or more, more preferably 10% or more in order to compensate desorbed oxygen. Alternatively, as the dehydration or dehydrogenation treatment, plasma treatment, UV treatment, or chemical treatment may be performed.

Then, oxygen may be added to the first layer 133a from the upper surface side of the first layer 133a. The addition of oxygen may be performed by an ion implantation method or an ion doping method. In that case, the acceleration voltage is made higher than or equal to 5 kV and lower than or equal to 100 kV. The amount of added oxygen is made greater than or equal to $1 \times 10^{14}$ ions/cm$^2$ and less than or equal to $1 \times 10^{16}$ ions/cm$^2$. Note that oxygen may be further added to the first layer 133a from the upper surface side of the first layer 133a under a different condition.

Alternatively, the addition of oxygen may be performed by application of a bias voltage to the substrate side in plasma containing oxygen. In that case, the bias voltage is made higher than or equal to 10 V and lower than 1 kV. The application time of the bias voltage is made longer than or equal to 10 s and shorter than or equal to 1000 s, preferably longer than or equal to 10 s and shorter than or equal to 200 s, more preferably longer than or equal to 10 s and shorter than or equal to 60 s.

By the addition of oxygen, the first layer 133a can be an insulating film containing excess oxygen. Note that the formation method of the insulating film containing excess oxygen is not limited to the above. For example, the insulating film containing excess oxygen can be formed also by a sputtering method under an atmosphere containing a high proportion of oxygen with the substrate temperature higher than or equal to room temperature and lower than or equal to 150° C. Specifically, the proportion of oxygen may be set to 20% or higher, preferably 50% or higher, more preferably 80% or higher. The formation methods of the insulating film containing excess oxygen may be combined as appropriate.

The first layer 133a containing excess oxygen may be formed in the above manner. Note that this embodiment is not limited to the case where the first layer 133a contains excess oxygen.

Next, a second layer 133b is formed. The second layer 133b may be formed using any of the above materials for the second layer 132b by a sputtering method, a CVD method, an MBE method, an ALD method, or a PLD method.

Figure 5C:
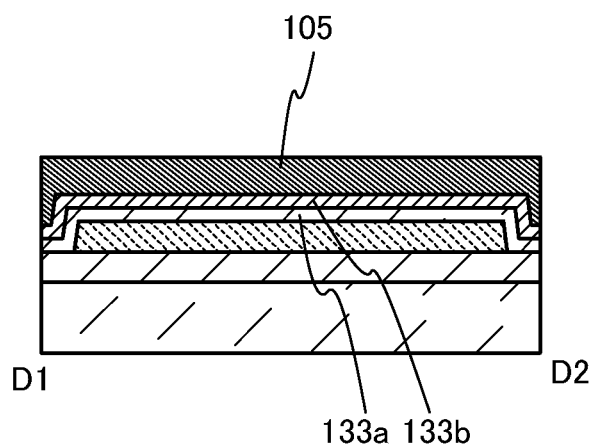

Then, a conductive film 105 is formed (see FIG. 5C). The conductive film 105 may be formed using any of the above materials for the gate electrode 104 by a sputtering method, a CVD method, an MBE method, an ALD method, or a PLD method.

Next, the conductive film 105 is processed to form the gate electrode 104.

Figure 6A:
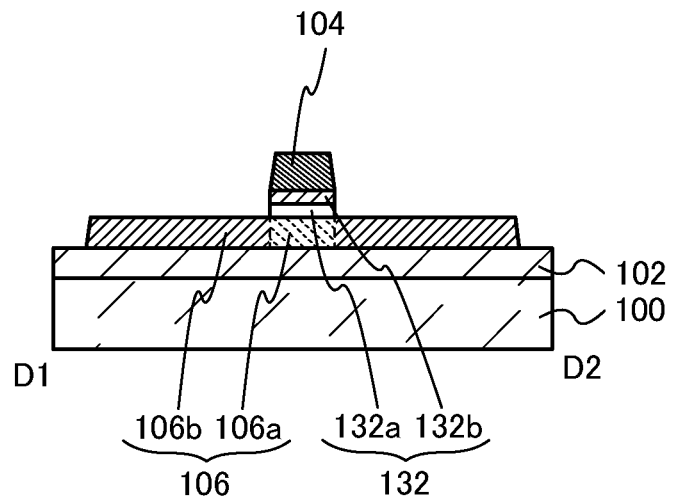
FIGS. 6A to 6C are cross-sectional views illustrating the example of the method of manufacturing the semiconductor device according to one embodiment of the present invention.

Next, the second layer 133b and the first layer 133a are processed with the use of the gate electrode 104 as a mask or with the use of a mask used for the processing for forming the gate electrode 104, whereby the gate insulating film 132 including the second layer 132b and the first layer 132a is formed (see FIG. 6A).

Then, an impurity is added to the oxide semiconductor film 107 with the gate electrode 104 used as a mask. As the impurity, one or more of helium, boron, nitrogen, fluorine, neon, aluminum, phosphorus, argon, arsenic, krypton, indium, tin, antimony, and xenon may be added. The impurity may be added by an ion implantation method or an ion doping method. At this time, the acceleration voltage is made higher than or equal to 5 kV and lower than or equal to 100 kV. The amount of the added impurity is made greater than or equal to $1 \times 10^{14}$ ions/cm$^2$ and less than or equal to $1 \times 10^{16}$ ions/cm$^2$. After that, heat treatment may be performed.

By the addition of the impurity (and the heat treatment), the resistance of part of the oxide semiconductor film 107 is reduced. Here, regions whose resistance is reduced become the regions 106b, and a region whose resistance is not reduced becomes the region 106a; the regions 106b and the region 106a are collectively referred to as the oxide semiconductor film 106.

Note that a method of adding the impurity to the oxide semiconductor film 107 after the gate insulating film 132 is formed is described in this embodiment; however, the order of the steps is not limited thereto. For example, the impurity may be added to the oxide semiconductor film 107 through the second layer 133b and the first layer 133a after the gate electrode 104 is formed. By the addition of the impurity through the second layer 133b and the first layer 133a, damage to the oxide semiconductor film 107 is unlikely to be caused.

Figure 6B:
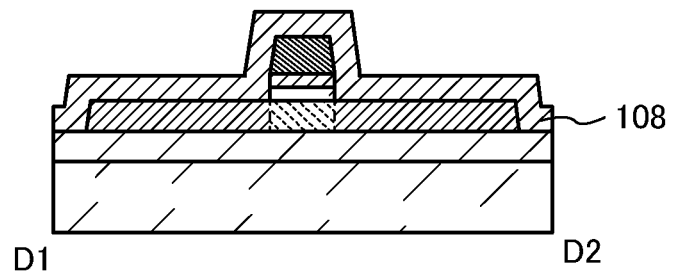

Next, the barrier film 108 is formed (see FIG. 6B). The barrier film 108 may be formed using any of the above materials for the barrier film 108 by a sputtering method, a CVD method, an MBE method, an ALD method, or a PLD method.

After the barrier film 108 is formed, second heat treatment is performed. By the second heat treatment, oxygen can be released from the base insulating film 102 and/or the gate insulating film 132. Released oxygen is supplied to the oxide semiconductor film 106, whereby oxygen vacancies can be reduced. Further, an influence of a parasitic channel can be reduced. The second heat treatment may be performed under a condition similar to that of the first heat treatment.

There is no particular limitation on the timing of the second heat treatment as long as it is after the formation of the barrier film 108. Note that the second heat treatment is not necessarily performed.

In this manner, the transistor in FIGS. 4A to 4C can be manufactured.

In the transistor in FIGS. 4A to 4C, the oxide semiconductor film 106 has few oxygen vacancies and an influence of a parasitic channel is small; thus, the transistor can have switching characteristics even when miniaturized.

Next, the interlayer insulating film 118 is formed over the barrier film 108. The interlayer insulating film 118 may be formed using any of the above materials for the interlayer insulating film 118 by a sputtering method, a CVD method, an MBE method, an ALD method, or a PLD method.

Then, the openings are provided in the interlayer insulating film 118 and the barrier film 108, so that the oxide semiconductor film 106 is exposed.

Then, a conductive film to be the wirings 136 is formed. The conductive film to be the wirings 136 may be formed using any of the above materials for the wirings 136 by a sputtering method, a CVD method, an MBE method, an ALD method, or a PLD method.

Figure 6C:
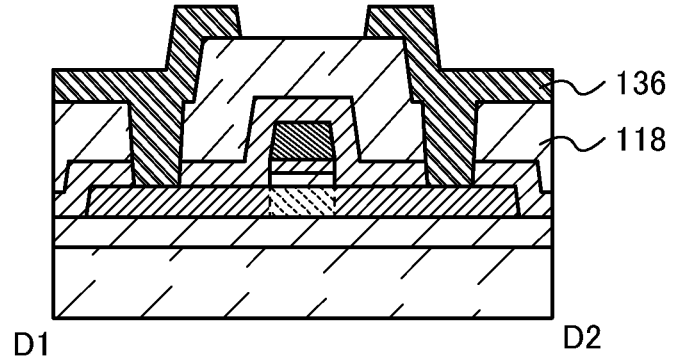

Next, the conductive film to be the wirings 136 is processed to form the wirings 136 (see FIG. 6C).

According to this embodiment, a transistor that can have switching characteristics even when miniaturized can be provided. Further, a highly integrated semiconductor device including the transistor can be provided.

This embodiment can be implemented in appropriate combination with any of the other embodiments.

Embodiment 2

In this embodiment, a transistor having a different structure from any of the transistors in Embodiment 1 will be described.

Figure 7A:
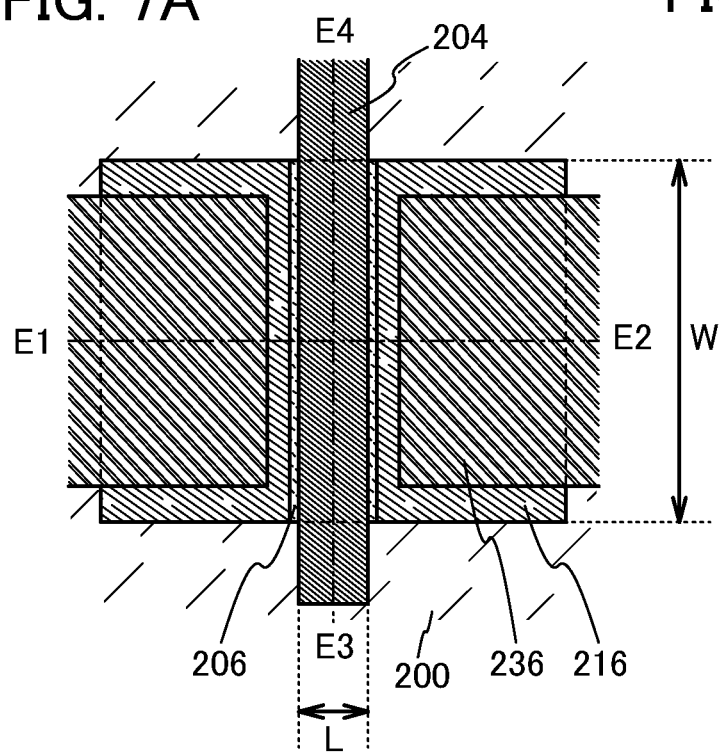
FIGS. 7A to 7C are a top view and cross-sectional views illustrating an example of a semiconductor device according to one embodiment of the present invention.
Figure 7C:
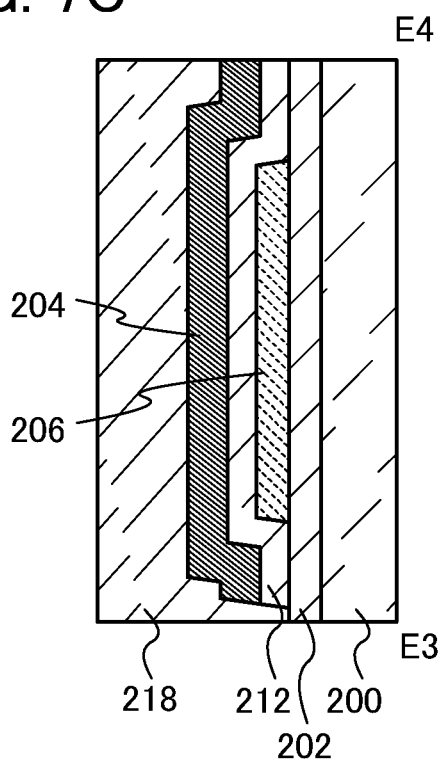
Figure 7B:
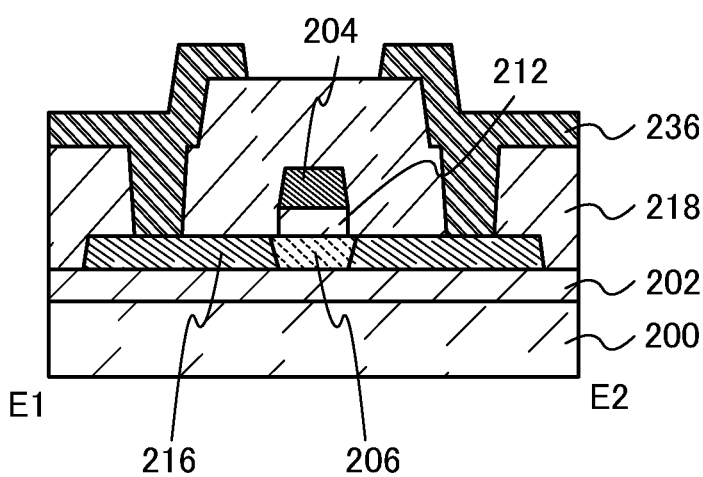

FIG. 7A is a top view of a transistor according to one embodiment of the present invention. FIG. 7B is a cross-sectional view taken along dashed-dotted line E1-E2 in FIG. 7A. FIG. 7C is a cross-sectional view taken along dashed-dotted line E3-E4 in FIG. 7A. Note that a base insulating film 202 and the like are not illustrated in FIG. 7A for simplicity.

In FIG. 7A, the channel length (L) and the channel width (W) of the transistor are shown. Note that the channel region of the transistor corresponds to a region of an oxide semiconductor film 206 overlapping with a gate electrode 204. At least two side surfaces of the oxide semiconductor film 206 overlap with the gate electrode 204.

In the transistor illustrated in FIG. 7A, the channel length is greater than or equal to 5 nm and less than 60 nm, and the channel width is greater than or equal to 5 nm and less than 200 nm.

Further, in the transistor illustrated in FIG. 7A, the ratio of the channel width to the channel length is 0.5:1 to 10:1.

FIG. 7B illustrates a cross-sectional structure of the transistor including the base insulating film 202 provided over a substrate 200; the oxide semiconductor film 206 provided over the base insulating film 202; a pair of electrodes 216 provided on the same layer as the oxide semiconductor film 206; a gate insulating film 212 provided over the oxide semiconductor film 206; and the gate electrode 204 provided over the gate insulating film 212 so as to overlap with the oxide semiconductor film 206.

Note that in FIG. 7B, an interlayer insulating film 218 which is provided over the oxide semiconductor film 206, the pair of electrodes 216, and the gate electrode 204 and has openings reaching the pair of electrodes 216, and wirings 236 provided in contact with the pair of electrodes 216 through the openings in the interlayer insulating film 218 are illustrated.

The substrate 200 may be formed using a material similar to that for the substrate 100.

The base insulating film 202 may be formed using a material similar to that for the base insulating film 102.

The gate electrode 204 may be formed using a material similar to that for the gate electrode 104.

The gate insulating film 212 may be formed using a material similar to that for the gate insulating film 112. Note that the gate insulating film 212 may have a layer structure similar to that of the gate insulating film 132.

The oxide semiconductor film 206 may be formed using a material similar to that for the oxide semiconductor film 106.

The interlayer insulating film 218 may be formed using a material similar to that for the interlayer insulating film 118.

The wirings 236 may be formed using a material similar to that for the wirings 136.

The pair of electrodes 216 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

Although not illustrated, a barrier film may be formed over the base insulating film 202, the pair of electrodes 216, the oxide semiconductor film 206, and the gate electrode 204. The barrier film may be formed using a material similar to that for the barrier film 108, which enables the barrier film to have a function similar to that of the barrier film 108.

From the above, the transistor in FIGS. 7A to 7C is different from the transistors in FIGS. 1A to 1C, FIGS. 2A to 2C, FIGS. 3A to 3C, and FIGS. 4A to 4C in the shape of the oxide semiconductor film 206 and in the presence of the pair of electrodes 216. Therefore, for structures of the other components, the description with reference to FIGS. 1A to 1C, FIGS. 2A to 2C, FIGS. 3A to 3C, and FIGS. 4A to 4C can be referred to.

The transistor in FIGS. 7A to 7C has a structure in which the pair of electrodes 216 is provided instead of the regions 106b of the oxide semiconductor film 106 in the transistor in FIGS. 1A to 1C. Therefore, the resistance between a source and a drain can be made lower than that in any of the transistors described in Embodiment 1. Accordingly, such a transistor can have excellent on-state characteristics even when miniaturized.

A method of manufacturing the transistor in FIGS. 7A to 7C will be described below with reference to FIGS. 8A to 8D. Here, only cross-sectional views corresponding to FIG. 7B are illustrated for simplicity.

First, the substrate 200 is prepared.

Next, the base insulating film 202 is formed over the substrate 200. The base insulating film 202 may be formed using a material and a method similar to those for the base insulating film 102.

Next, a conductive film to be the pair of electrodes 216 is formed. The conductive film to be the pair of electrodes 216 may be formed using any of the above materials for the pair of electrodes 216 by a sputtering method, a CVD method, an MBE method, an ALD method, or a PLD method.

Then, the conductive film to be the pair of electrodes 216 is processed to form a conductive film 217 having an opening through which the base insulating film 202 is exposed.

Figure 8A:
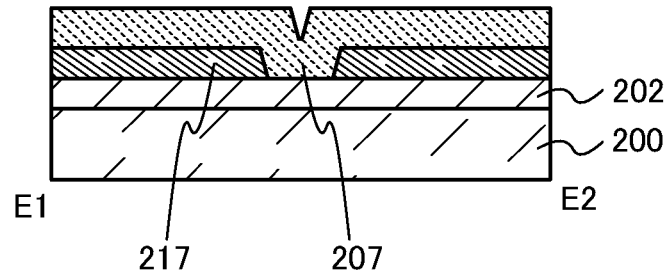
FIGS. 8A to 8D are cross-sectional views illustrating an example of a method of manufacturing the semiconductor device according to one embodiment of the present invention.

Next, an oxide semiconductor film 207 is formed (see FIG. 8A). The oxide semiconductor film 207 may be formed using any of the above materials and methods for the oxide semiconductor film 106.

After the oxide semiconductor film 207 is formed, first heat treatment may be performed. For the first heat treatment, the first heat treatment described in Embodiment 1 is referred to.

Next, planarization treatment is performed on the oxide semiconductor film 207 and the conductive film 217. As the planarization treatment, CMP treatment or the like may be used. Through the planarization treatment, the oxide semiconductor film is provided only in the opening in the conductive film 217.

Figure 8B:
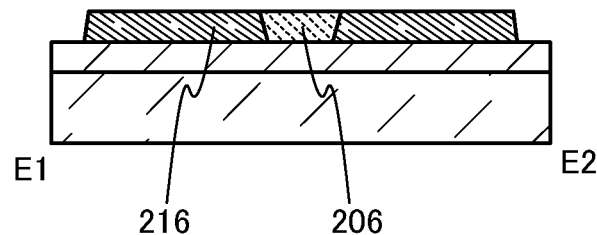

Then, the conductive film 217 and the oxide semiconductor film provided only in the opening in the conductive film 217 are processed into an island shape, so that the oxide semiconductor film 206 and the pair of electrodes 216 are formed (see FIG. 8B).

Figure 8C:
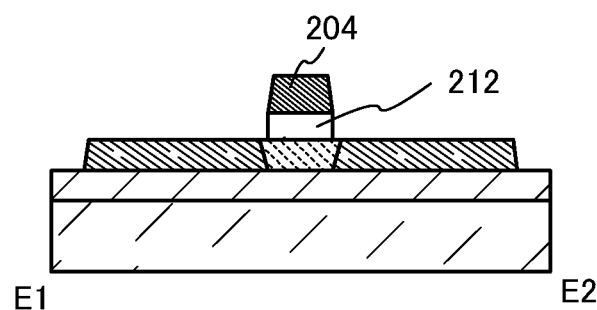
Figure 8D:
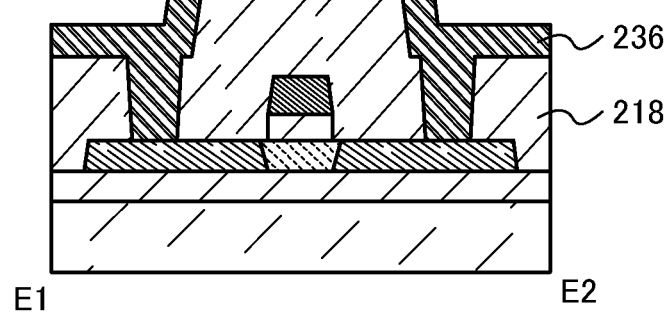

Next, the gate insulating film 212 and the gate electrode 204 over the gate insulating film 212 are formed (see FIG. 8C). The gate insulating film 212 may be formed using a material and a method similar to those for the gate insulating film 112 or the gate insulating film 132. The gate electrode 204 may be formed using a material and a method similar to those for the gate electrode 104.

Then, a bather film may be formed. The barrier film may be formed using a material and a method similar to those for the barrier film 108.

In this manner, the transistor in FIGS. 7A to 7C can be manufactured.

In the transistor in FIGS. 7A to 7C, the oxide semiconductor film 206 has few oxygen vacancies and an influence of a parasitic channel is small; thus, the transistor can have switching characteristics even when miniaturized. Further, since the pair of electrodes 216 is provided, the transistor can have excellent on-state characteristics even when miniaturized.

Next, the interlayer insulating film 218 is formed. The interlayer insulating film 218 may be formed using a material and a method similar to those for the interlayer insulating film 118.

Then, the openings are provided in the interlayer insulating film 218, so that the pair of electrodes 216 is exposed.

Next, the wirings 236 are formed. The wirings 236 may be formed using a material and a method similar to those for the wirings 136 (see FIG. 8D).

According to this embodiment, a transistor that can have switching characteristics and excellent on-state characteristics even when miniaturized can be provided. Further, a highly integrated semiconductor device including the transistor can be provided.

This embodiment can be implemented in appropriate combination with any of the other embodiments.

Embodiment 3

In this embodiment, a transistor having a different structure from any of the transistors in Embodiments 1 and 2 will be described.

FIG. 9A is a top view of a transistor according to one embodiment of the present invention. FIG. 9B is a cross-sectional view taken along dashed-dotted line F1-F2 in FIG. 9A. FIG. 9C is a cross-sectional view taken along dashed-dotted line F3-F4 in FIG. 9A. Note that a base insulating film 302 and the like are not illustrated in FIG. 9A for simplicity.

In FIG. 9A, the channel length (L) and the channel width (W) of the transistor are shown. Note that the channel region of the transistor corresponds to a region of an oxide semiconductor film 306 overlapping with a gate electrode 304. At least two side surfaces of the oxide semiconductor film 306 overlap with the gate electrode 304.

In the transistor illustrated in FIG. 9A, the channel length is greater than or equal to 5 nm and less than 60 nm, and the channel width is greater than or equal to 5 nm and less than 200 nm.

Further, in the transistor illustrated in FIG. 9A, the ratio of the channel width to the channel length is 0.5:1 to 10:1.

FIG. 9B is a cross-sectional view of the transistor including the base insulating film 302 provided over a substrate 300; the oxide semiconductor film 306 which is provided over the base insulating film 302 and includes a first region 306a and second regions 306b; a gate insulating film 312 provided over the oxide semiconductor film 306; the gate electrode 304 provided over the gate insulating film 312 so as to overlap with the oxide semiconductor film 306; an insulating film 320 provided over the gate electrode 304; sidewall insulating films 310 provided in contact with side surfaces of the gate electrode 304 and the insulating film 320; a pair of electrodes 316 provided over the oxide semiconductor film 306 and in contact with the sidewall insulating films 310 and the second regions 306b of the oxide semiconductor film 306; and an interlayer insulating film 318 which is provided over the pair of electrodes 316 and whose top surface is level with that of the insulating film 320.

Note that in FIG. 9B, an interlayer insulating film 328 provided over the interlayer insulating film 318 and the insulating film 320, and wirings 336 provided in contact with the pair of electrodes 316 through openings which are provided in the interlayer insulating film 318 and the interlayer insulating film 328 so as to reach the pair of electrodes 316 are illustrated.

In FIG. 9B, the shape of the gate electrode 304 is similar to that of the insulating film 320 when seen from above. The shape of the gate insulating film 312 is similar to that of the gate electrode 304 and the sidewall insulating films 310 when seen from above.

The first region 306a of the oxide semiconductor film 306 serves as the channel region of the transistor. The second regions 306b of the oxide semiconductor film 306 serve as a source region and a drain region of the transistor.

In the transistor in FIGS. 9A to 9C, the pair of electrodes 316 is provided close to the gate electrode 304 with the sidewall insulating films 310 interposed therebetween. Therefore, the resistance between the source and the drain can be low. Accordingly, the transistor can have excellent on-state characteristics.

The substrate 300 may be formed using a material similar to that for the substrate 100.

The base insulating film 302 may be formed using a material similar to that for the base insulating film 102.

The gate electrode 304 may be formed using a material similar to that for the gate electrode 104.

The gate insulating film 312 may be formed using a material similar to that for the gate insulating film 112. Note that the gate insulating film 312 may have a layer structure similar to that of the gate insulating film 132.

The oxide semiconductor film 306 may be formed using a material similar to that for the oxide semiconductor film 106.

The sidewall insulating films 310 may be formed using one or more of the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The insulating film 320 may be formed using one or more of the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The pair of electrodes 316 may be formed using a material similar to that for the pair of electrodes 216.

The interlayer insulating film 318 may be formed using a material similar to that for the interlayer insulating film 218.

The interlayer insulating film 328 may be formed using a material similar to that for the interlayer insulating film 218.

The wirings 336 may be formed using a material similar to that for the wirings 136.

Although not illustrated, a barrier film may be formed over the base insulating film 302, the pair of electrodes 316, the oxide semiconductor film 306, the insulating film 320, and the gate electrode 304. The barrier film may be formed using a material similar to that for the barrier film 108, which enables the barrier film to have a function similar to that of the barrier film 108.

A method of manufacturing the transistor in FIGS. 9A to 9C will be described below with reference to FIGS. 10A to 10C, FIGS. 11A to 11C, and FIGS. 12A to 12C. Here, only cross-sectional views corresponding to FIG. 9B are illustrated for simplicity.

First, the substrate 300 is prepared.

Next, the base insulating film 302 is formed. The base insulating film 302 may be formed using a material and a method similar to those for the base insulating film 102.

Next, an oxide semiconductor film 307 is formed. The oxide semiconductor film 307 may be formed using a material and a method similar to those for the oxide semiconductor film 107.

Next, a gate insulating film 313 is formed. The gate insulating film 313 may be formed using a material and a method similar to those for the gate insulating film 112 or the gate insulating film 132.

Next, a conductive film 305 is formed. The conductive film 305 may be formed using any of the above materials for the gate electrode 304 by a sputtering method, a CVD method, an MBE method, an ALD method, or a PLD method.

Figure 10A:
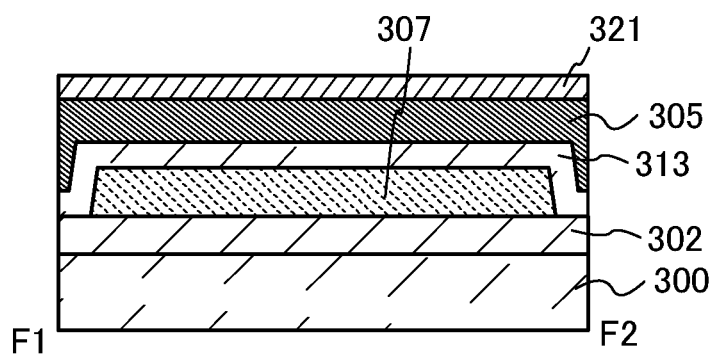
FIGS. 10A to 10C are cross-sectional views illustrating an example of a method of manufacturing the semiconductor device according to one embodiment of the present invention.

Then, an insulating film 321 is formed (see FIG. 10A). The insulating film 321 may be formed using any of the above materials for the insulating film 320 by a sputtering method, a CVD method, an MBE method, an ALD method, or a PLD method.

Figure 10B:
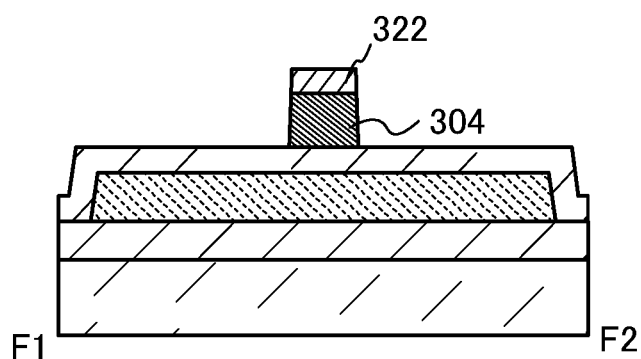
Figure 10C:
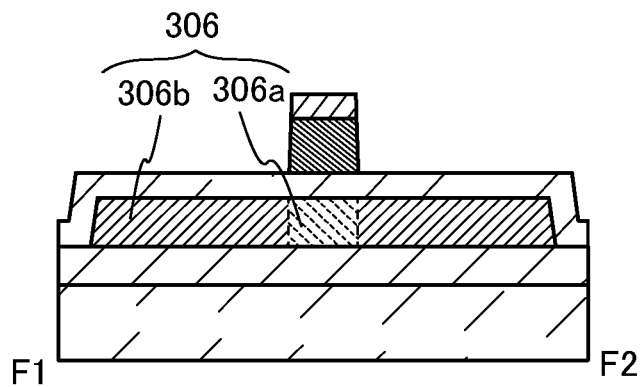

Next, the insulating film 321 and the conductive film 305 are processed, whereby an insulating film 322 and the gate electrode 304 are formed (see FIG. 10B). The shape of the insulating film 322 is similar to that of the gate electrode 304 when seen from above.

Then, an impurity is added to the oxide semiconductor film 307 with the insulating film 322 and the gate electrode 304 used as masks. Specifically, as the impurity, one or more of helium, boron, nitrogen, fluorine, neon, aluminum, phosphorus, argon, arsenic, krypton, indium, tin, antimony, and xenon may be added. The impurity may be added by an ion implantation method or an ion doping method. Preferably, an ion implantation method is used. At this time, the acceleration voltage is made higher than or equal to 5 kV and lower than or equal to 100 kV. The amount of the added impurity is made greater than or equal to $1\times10^{14}$ ions/cm$^2$ and less than or equal to $1\times10^{16}$ ions/cm$^2$. After that, heat treatment may be performed.

The resistance of regions to which the impurity is added is reduced, and the regions become the second regions 306b. A region to which the impurity is not added becomes the first region 306a. Thus, the oxide semiconductor film 306 including the first region 306a and the second regions 306b is formed (see FIG. 10C).

Next, an insulating film to be the sidewall insulating films 310 is formed. The insulating film to be the sidewall insulating films 310 may be formed using any of the above materials for the sidewall insulating films 310 by a sputtering method, a CVD method, an MBE method, an ALD method, or a PLD method. Then, highly anisotropic etching treatment is performed on the insulating film to be the sidewall insulating films 310, whereby the sidewall insulating films 310 can be formed in contact with side surfaces of the insulating film 322 and the gate electrode 304.

Figure 11A:
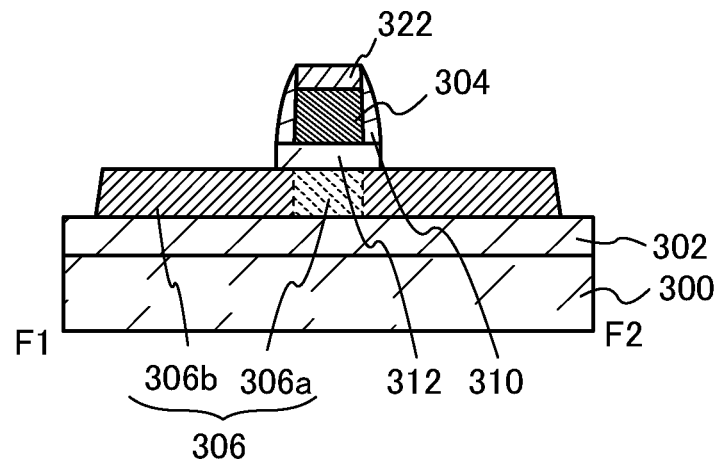
FIGS. 11A to 11C are cross-sectional views illustrating the example of the method of manufacturing the semiconductor device according to one embodiment of the present invention.

Processing of the gate insulating film 313 with the sidewall insulating films 310 and the gate electrode 304 used as masks is performed at the same time as the formation of the sidewall insulating films 310, whereby the gate insulating film 312 is formed (see FIG. 11A).

Figure 11B:
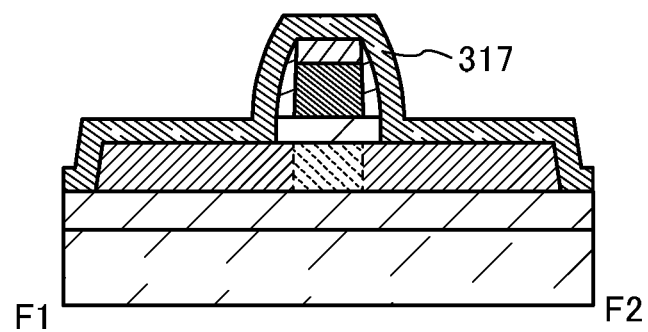

Then, a conductive film 317 is formed (see FIG. 11B). The conductive film 317 may be formed using any of the above materials for the pair of electrodes 316 by a sputtering method, a CVD method, an MBE method, an ALD method, or a PLD method.

After the conductive film 317 is formed, second heat treatment is performed. By the second heat treatment, oxygen can be released from the base insulating film 302 and/or the gate insulating film 312. Released oxygen is supplied to the oxide semiconductor film 306, whereby oxygen vacancies can be reduced. The second heat treatment may be performed under a condition similar to that of the second heat treatment described in Embodiment 1.

The second heat treatment is not necessarily performed just after the formation of the conductive film 317; there is no particular limitation on the timing of the second heat treatment as long as it is after the formation of the conductive film 317.

Figure 11C:
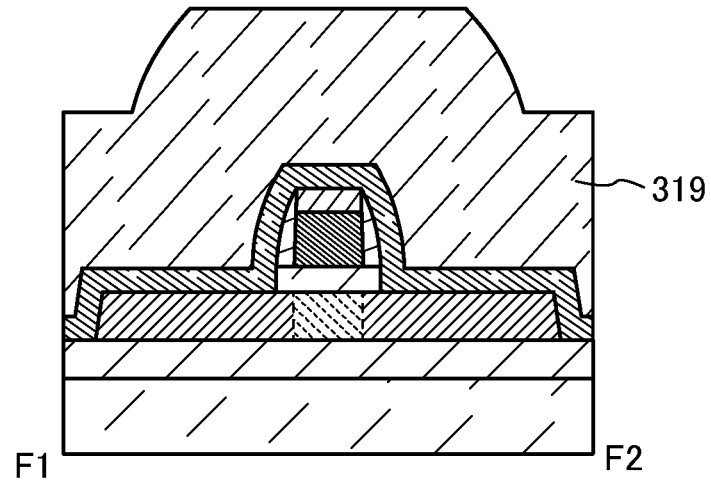

Next, an interlayer insulating film 319 is formed (see FIG. 11C). The interlayer insulating film 319 may be formed using any of the above materials for the interlayer insulating film 318 by a sputtering method, a CVD method, an MBE method, an ALD method, or a PLD method.

Figure 12A:
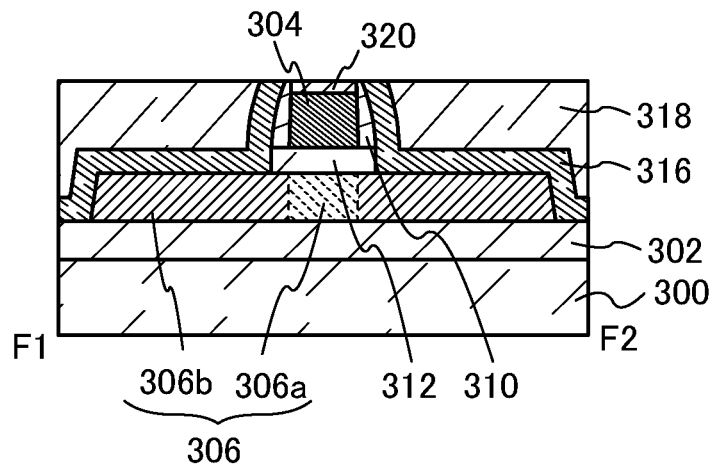
FIGS. 12A to 12C are cross-sectional views illustrating the example of the method of manufacturing the semiconductor device according to one embodiment of the present invention.

Next, planarization treatment (such as CMP treatment or dry etching treatment) is performed from the upper surface side of the interlayer insulating film 319, whereby the pair of electrodes 316, the interlayer insulating film 318, the sidewall insulating films 310, and the insulating film 320 are formed (see FIG. 12A).

By performing the planarization treatment from the upper surface side of the interlayer insulating film 319, only a region of the conductive film 317 overlapping with the insulating film 322 (and the gate electrode 304) can be removed. At that time, the insulating film 322 is also subjected to the planarization treatment to be the insulating film 320 with a smaller thickness.

By the formation of the pair of electrodes 316 in this manner, the pair of electrodes 316 can be provided close to the gate electrode 304 with the sidewall insulating films 310 interposed therebetween.

In this manner, the transistor in FIGS. 9A to 9C can be manufactured.

In the transistor in FIGS. 9A to 9C, the oxide semiconductor film 306 has few oxygen vacancies and an influence of a parasitic channel is small; thus, the transistor can have switching characteristics even when miniaturized. Further, since the pair of electrodes 316 is provided, the transistor can have excellent on-state characteristics even when miniaturized.

Figure 12B:
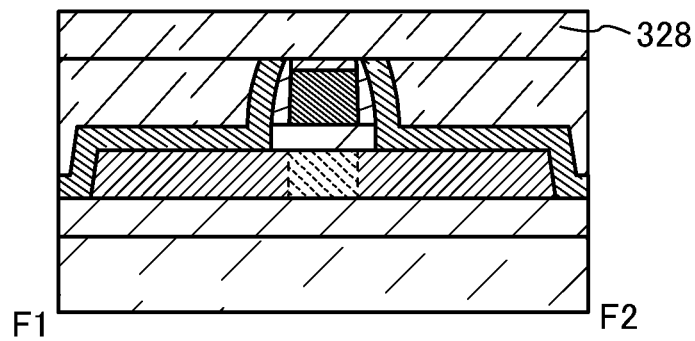

Then, the interlayer insulating film 328 is formed (see FIG. 12B). The interlayer insulating film 328 may be formed using any of the above materials for the interlayer insulating film 328 by a sputtering method, a CVD method, an MBE method, an ALD method, or a PLD method.

Next, the interlayer insulating film 328 and the interlayer insulating film 318 are processed, so that the openings through which the pair of electrodes 316 is exposed are formed.

Figure 12C:
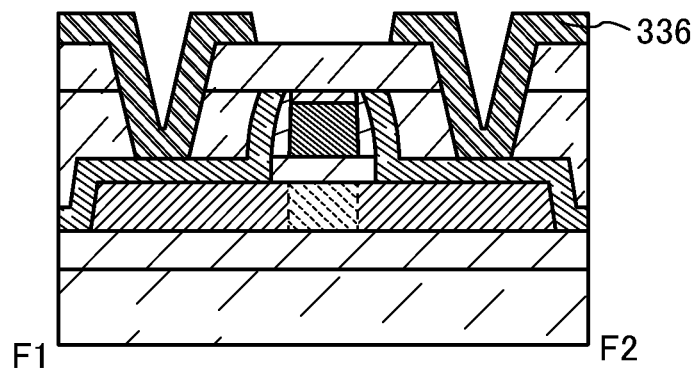

Next, the wirings 336 are formed (see FIG. 12C). The wirings 336 may be formed using a material and a method similar to those for the wirings 136.

According to this embodiment, a transistor that can have switching characteristics and excellent on-state characteristics even when miniaturized can be provided. Further, a highly integrated semiconductor device including the transistor can be provided.

This embodiment can be implemented in appropriate combination with any of the other embodiments.

Embodiment 4

In this embodiment, a transistor having a different structure from any of the transistors in Embodiments 1 to 3 will be described.

Figure 13A:
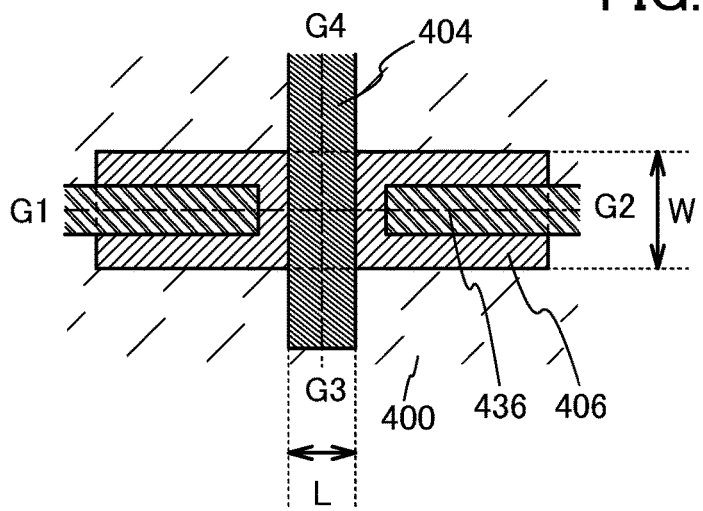
FIGS. 13A to 13C are a top view and cross-sectional views illustrating an example of a semiconductor device according to one embodiment of the present invention.
Figure 13C:
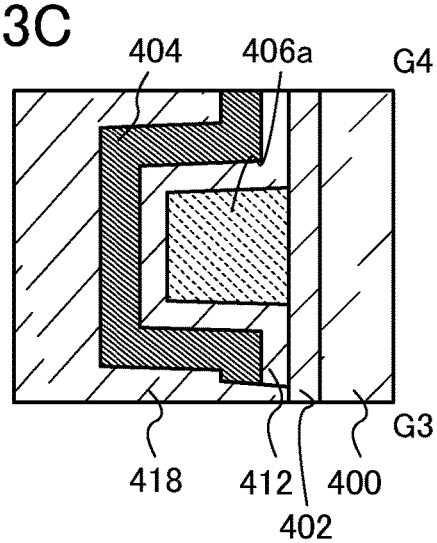
Figure 13B:
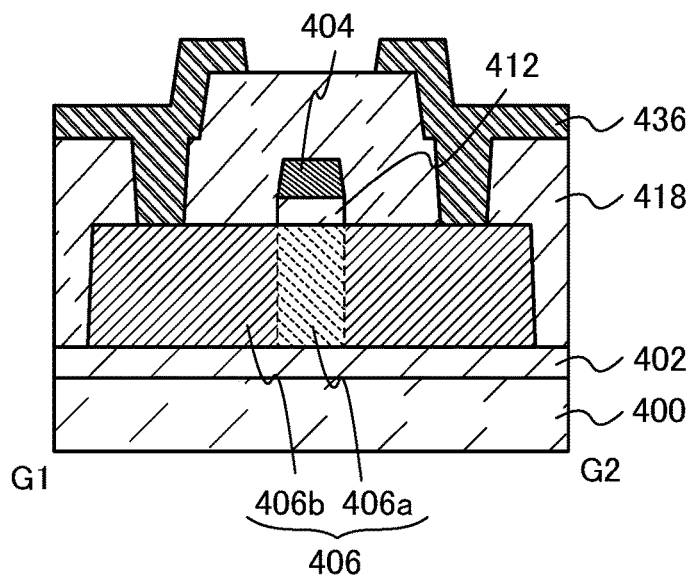

FIG. 13A is a top view of a transistor according to one embodiment of the present invention. FIG. 13B is a cross-sectional view taken along dashed-dotted line G1-G2 in FIG. 13A. FIG. 13C is a cross-sectional view taken along dashed-dotted line G3-G4 in FIG. 13A. Note that a base insulating film 402 and the like are not illustrated in FIG. 13A for simplicity.

In FIG. 13A, the channel length (L) and the channel width (W) of the transistor are shown. Note that the channel region of the transistor corresponds to a region of an oxide semiconductor film 406 overlapping with a gate electrode 404. At least two side surfaces of the oxide semiconductor film 406 overlap with the gate electrode 404.

In the transistor illustrated in FIG. 13A, the channel length is greater than or equal to 5 nm and less than 60 nm, and the channel width is greater than or equal to 5 nm and less than 200 nm.

Further, in the transistor illustrated in FIG. 13A, the ratio of the channel width to the channel length is 0.5:1 to 10:1.

FIG. 13B illustrates a cross-sectional structure of the transistor including the base insulating film 402 provided over a substrate 400; the oxide semiconductor film 406 which is provided over the base insulating film 402 and whose thickness is 1 to 5 times as large as the channel width; a gate insulating film 412 provided over the oxide semiconductor film 406; and the gate electrode 404 provided over the gate insulating film 412 so as to overlap with the oxide semiconductor film 406.

Note that in FIG. 13B, an interlayer insulating film 418 which is provided over the oxide semiconductor film 406 and the gate electrode 404 and has openings reaching the oxide semiconductor film 406, and wirings 436 provided in contact with the oxide semiconductor film 406 through the openings in the interlayer insulating film 418 are illustrated.

The transistor in FIGS. 13A to 13C is a so-called fin transistor. The fin transistor can have a large conduction path of carriers because of its thick channel region, and can have excellent on-state characteristics even in the case where the channel width is small.

In the case of a fin transistor including silicon, a depletion layer due to an electric field of a gate is not completely extended because of its thick channel region; thus, there is a problem in that it is difficult to completely turn off the transistor. On the other hand, in the case of a fin transistor including an oxide semiconductor film, a depletion layer due to an electric field of a gate can be sufficiently extended even when a channel region is thick; thus, the transistor can be turned off.

The substrate 400 may be formed using a material similar to that for the substrate 100.

The base insulating film 402 may be formed using a material similar to that for the base insulating film 102.

The gate electrode 404 may be formed using a material similar to that for the gate electrode 104.

The gate insulating film 412 may be formed using a material similar to that for the gate insulating film 112. Note that the gate insulating film 412 may have a layer structure similar to that of the gate insulating film 132.

The oxide semiconductor film 406 may be formed using a material similar to that for the oxide semiconductor film 106. The thickness of the oxide semiconductor film 406 is greater than or equal to 100 nm and less than 2 μm.

The interlayer insulating film 418 may be formed using a material similar to that for the interlayer insulating film 118.

The wirings 436 may be formed using a material similar to that for the wirings 136.

Although not illustrated, a barrier film may be formed over the base insulating film 402, the oxide semiconductor film 406, and the gate electrode 404. The barrier film may be formed using a material similar to that for the barrier film 108, which enables the barrier film to have a function similar to that of the barrier film 108.

A method of manufacturing the transistor in FIGS. 13A to 13C will be described below with reference to FIGS. 14A to 14C. Here, only cross-sectional views corresponding to FIG. 13B are illustrated for simplicity.

First, the substrate 400 is prepared.

Next, the base insulating film 402 is formed over the substrate 400. The base insulating film 402 may be formed using a material and a method similar to those for the base insulating film 102.

Figure 14A:
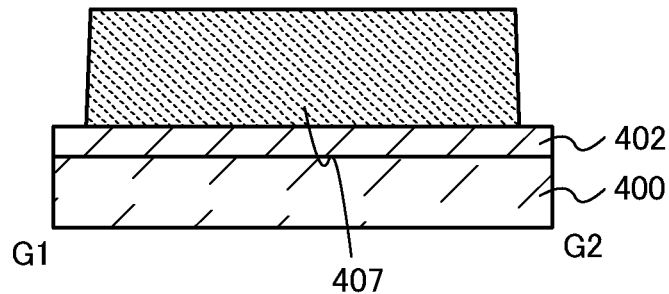
FIGS. 14A to 14C are cross-sectional views illustrating an example of a method of manufacturing the semiconductor device according to one embodiment of the present invention.

Next, an oxide semiconductor film 407 is formed (see FIG. 14A). The oxide semiconductor film 407 may be formed using a material and a method similar to those for the oxide semiconductor film 107.

Figure 14B:
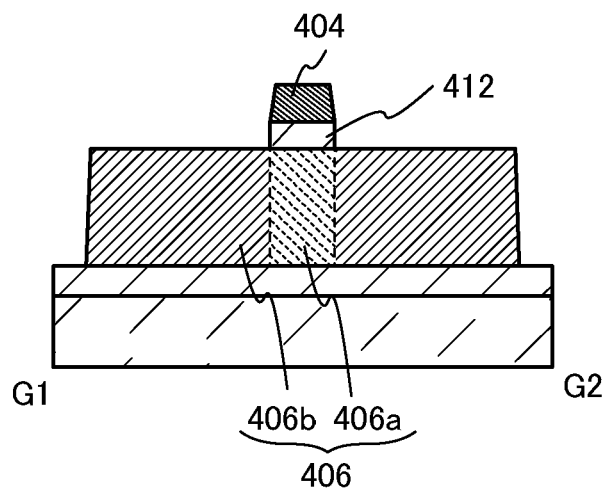
Figure 14C:
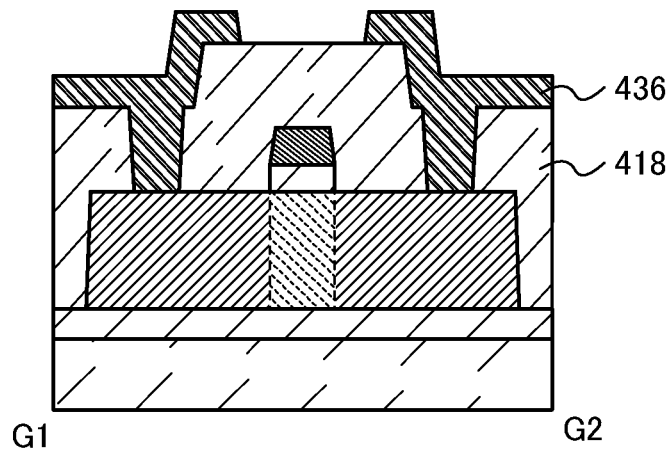

Next, the gate insulating film 412 and the gate electrode 404 over the gate insulating film 412 are formed (see FIG. 14B). The gate insulating film 412 may be formed using a material and a method similar to those for the gate insulating film 112 or the gate insulating film 132. The gate electrode 404 may be formed using a material and a method similar to those for the gate electrode 104.

Then, an impurity is added to the oxide semiconductor film 407 with the gate electrode 404 used as a mask. Specifically, as the impurity, one or more of helium, boron, nitrogen, fluorine, neon, aluminum, phosphorus, argon, arsenic, krypton, indium, tin, antimony, and xenon may be added. The impurity may be added by an ion implantation method or an ion doping method. Preferably, an ion implantation method is used. At this time, the acceleration voltage is made higher than or equal to 5 kV and lower than or equal to 100 kV. The amount of the added impurity is made greater than or equal to $1 \times 10^{14}$ ions/cm$^2$ and less than or equal to $1 \times 10^{16}$ ions/cm$^2$. After that, heat treatment may be performed.

Then, a bather film may be formed. The barrier film may be formed using a material and a method similar to those for the barrier film 108.

In this manner, the transistor in FIGS. 13A to 13C can be manufactured.

In the transistor in FIGS. 13A to 13C, the oxide semiconductor film 406 has few oxygen vacancies and an influence of a parasitic channel is small; thus, the transistor can have switching characteristics even when miniaturized. Further, since the thickness of the oxide semiconductor film 406 is 1 to 5 times as large as the channel width, the transistor can have excellent on-state characteristics even when miniaturized.

Next, the interlayer insulating film 418 is formed. The interlayer insulating film 418 may be formed using a material and a method similar to those for the interlayer insulating film 118.

Then, the openings are provided in the interlayer insulating film 418, so that the oxide semiconductor film 406 is exposed.

Next, the wirings 436 are formed. The wirings 436 may be formed using a material and a method similar to those for the wirings 136 (see FIG. 14C).

According to this embodiment, a transistor that can have switching characteristics and excellent on-state characteristics even when miniaturized can be provided. Further, a highly integrated semiconductor device including the transistor can be provided.

This embodiment can be implemented in appropriate combination with any of the other embodiments.

Embodiment 5

In this embodiment, a transistor having a different structure from any of the transistors in Embodiments 1 to 4 will be described.

Figure 15A:
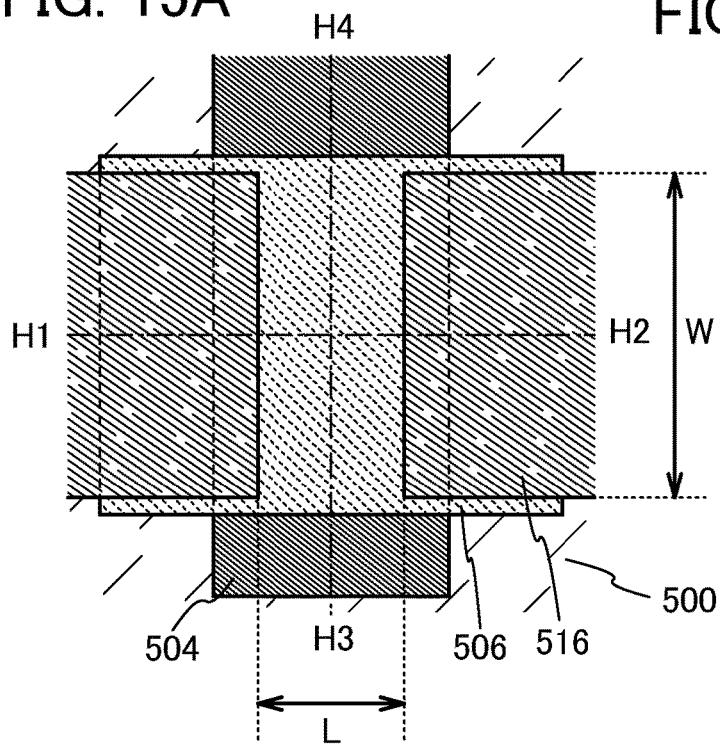
FIGS. 15A to 15C are a top view and cross-sectional views illustrating an example of a semiconductor device according to one embodiment of the present invention.
Figure 15C:
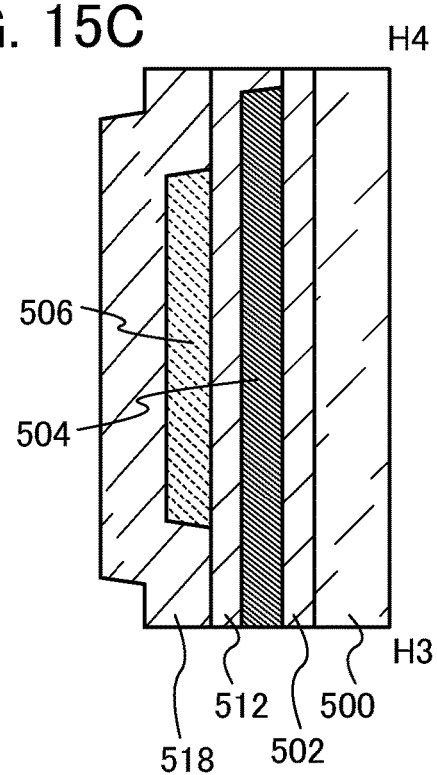
Figure 15B:
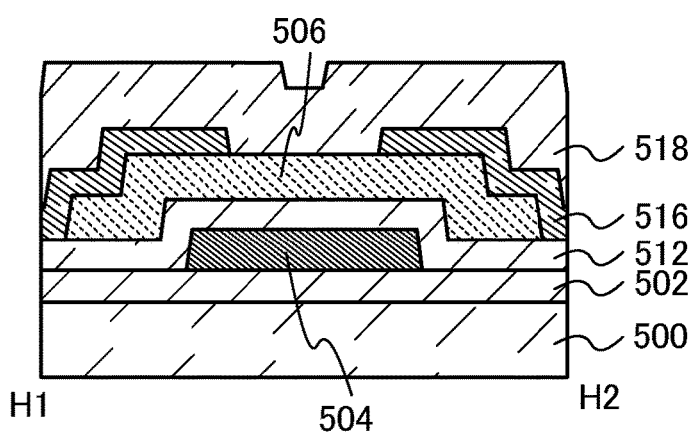

FIG. 15A is a top view of a transistor according to one embodiment of the present invention. FIG. 15B is a cross-sectional view taken along dashed-dotted line H1-H2 in FIG. 15A. FIG. 15C is a cross-sectional view taken along dashed-dotted line H3-H4 in FIG. 15A. Note that a base insulating film 502 and the like are not illustrated in FIG. 15A for simplicity.

In FIG. 15A, the channel length (L) and the channel width (W) of the transistor are shown. Note that the channel region of the transistor corresponds to a region of the oxide semiconductor film 506 which is located between a pair of electrodes 516 when seen from above. At least two side surfaces of the oxide semiconductor film 506 overlap with the gate electrode 504.

In the transistor illustrated in FIG. 15A, the channel length is greater than or equal to 5 nm and less than 60 nm, and the channel width is greater than or equal to 5 nm and less than 200 nm.

Further, in the transistor illustrated in FIG. 15A, the ratio of the channel width to the channel length is 0.5:1 to 10:1.

FIG. 15B is a cross-sectional view of the transistor including the base insulating film 502 provided over a substrate 500; the gate electrode 504 provided over the base insulating film 502; a gate insulating film 512 provided over the gate electrode 504; the oxide semiconductor film 506 provided so as to overlap with the gate electrode 504 with the gate insulating film 512 therebetween; the pair of electrodes 516 provided over the oxide semiconductor film 506; and an interlayer insulating film 518 provided over the pair of electrodes 516.

The substrate 500 may be formed using a material similar to that for the substrate 100.

The base insulating film 502 is provided in order that an impurity due to the substrate 500 is prevented from affecting the oxide semiconductor film 506. Note that in the case where the substrate 500 does not include an impurity, the base insulating film 502 is not necessarily provided. Further, in the case where an impurity can be prevented from being diffused by the gate insulating film 512, the base insulating film 502 is not necessarily provided.

The base insulating film 502 may be formed of a single layer or a stacked layer using one or more of the following materials: aluminum oxide, aluminum nitride, magnesium oxide, silicon oxide, silicon oxynitride, germanium oxide, yttrium oxide, zirconium oxide, lanthanum oxide, neodymium oxide, hafnium oxide, and tantalum oxide. In addition to the single layer or the stacked layer, silicon nitride oxide or silicon nitride may be stacked.

The gate electrode 504 may be formed using a material similar to that for the gate electrode 104.

The gate insulating film 512 may be formed using a material similar to that for the gate insulating film 112 or the gate insulating film 132.

The oxide semiconductor film 506 may be formed using a material similar to that for the oxide semiconductor film 106.

The pair of electrodes 516 may be formed using a material similar to that for the pair of electrodes 216.

The interlayer insulating film 518 may be formed of a single layer or a stacked layer using one or more of the following materials: aluminum oxide, aluminum nitride, magnesium oxide, silicon oxide, silicon oxynitride, germanium oxide, yttrium oxide, zirconium oxide, lanthanum oxide, neodymium oxide, hafnium oxide, and tantalum oxide. In addition to the single layer or the stacked layer, silicon nitride oxide or silicon nitride may be stacked.

It is preferable that the interlayer insulating film 518 have low relative permittivity and a sufficient thickness. For example, a silicon oxide film having a relative permittivity of approximately 3.8 and a thickness greater than or equal to 200 nm and less than or equal to 1000 nm may be provided. A top surface of the interlayer insulating film 518 has a little fixed charge because of the influence of atmospheric components and the like, which might cause the shift of the threshold voltage of the transistor. Therefore, it is preferable that the interlayer insulating film 518 have relative permittivity and a thickness such that the influence of the charge at the top surface is sufficiently reduced. For the same reason, a resin film of a polyimide resin, an acrylic resin, an epoxy resin, a silicone resin, or the like may be formed over the interlayer insulating film 518 in order to reduce the influence of the charge at the top surface of the interlayer insulating film 518.

A method of manufacturing the transistor in FIGS. 15A to 15C will be described below with reference to FIGS. 16A to 16C. Here, only cross-sectional views corresponding to FIG. 15B are illustrated for simplicity.

First, the substrate 500 is prepared.

Next, the base insulating film 502 is formed over the substrate 500. The base insulating film 502 may be formed using any of the above materials for the base insulating film 502 by a sputtering method, a CVD method, an MBE method, an ALD method, or a PLD method.

Next, the gate electrode 504 is formed. The gate electrode 504 may be formed using a material and a method similar to those for the gate electrode 104.

Figure 16A:
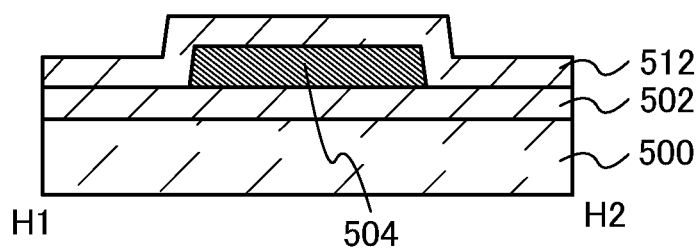
FIGS. 16A to 16C are cross-sectional views illustrating an example of a method of manufacturing the semiconductor device according to one embodiment of the present invention.

Next, the gate insulating film 512 is formed (see FIG. 16A). The gate insulating film 512 may be formed using a material and a method similar to those for the gate insulating film 112 or the gate insulating film 132.

Figure 16B:
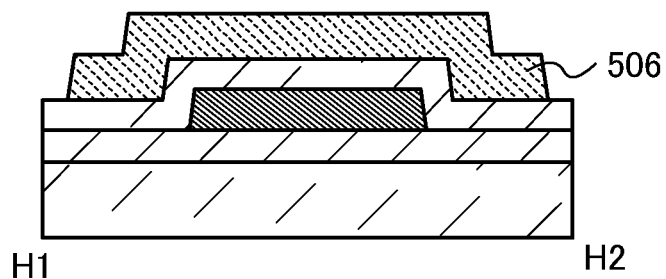

Next, the oxide semiconductor film 506 is formed (see FIG. 16B). The oxide semiconductor film 506 may be formed using a material and a method similar to those for the oxide semiconductor film 107.

Next, a conductive film to be the pair of electrodes 516 is formed. The conductive film to be the pair of electrodes 516 may be formed using any of the above materials for the pair of electrodes 516 by a sputtering method, a CVD method, an MBE method, an ALD method, or a PLD method.

Then, the conductive film to be the pair of electrodes 516 is processed to form the pair of electrodes 516. For part of the processing of the conductive film to be the pair of electrodes 516, an electron beam drawing equipment (also referred to as electron beam (EB) lithography system) is preferably used. An EB lithography system enables extremely minute processing, and thus is suitable for manufacturing a miniaturized transistor.

Figure 16C:
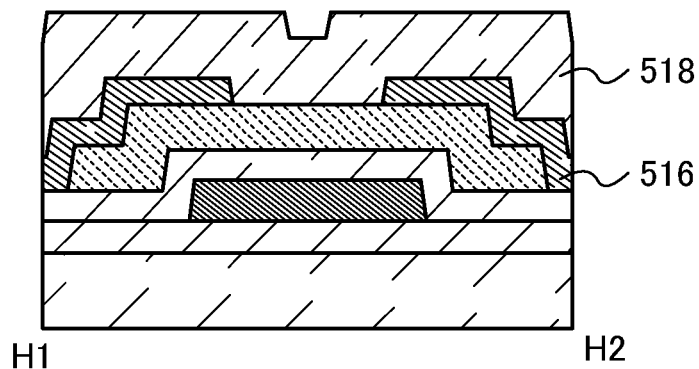

Next, the interlayer insulating film 518 is formed (see FIG. 16C). The interlayer insulating film 518 may be formed using any of the above materials for the interlayer insulating film 518 by a sputtering method, a CVD method, an MBE method, an ALD method, or a PLD method.

In this manner, the transistor in FIGS. 15A to 15C can be manufactured.

In the transistor in FIGS. 15A to 15C, the oxide semiconductor film 506 has few oxygen vacancies and an influence of a parasitic channel is small; thus, the transistor can have switching characteristics even when miniaturized. Further, since the pair of electrodes 516 is provided, the transistor can have excellent on-state characteristics even when miniaturized.

According to this embodiment, a transistor that can have switching characteristics and excellent on-state characteristics even when miniaturized can be provided. Further, a highly integrated semiconductor device including the transistor can be provided.

This embodiment can be implemented in appropriate combination with any of the other embodiments.

Embodiment 6

In this embodiment, an example of manufacturing a semiconductor memory device using any of the transistors described in Embodiments 1 to 5 will be described.

Typical examples of a volatile semiconductor memory device include a dynamic random access memory (DRAM) which stores data by selecting a transistor included in a memory element and accumulating an electric charge in a capacitor, and a static random access memory (SRAM) which holds stored data using a circuit such as a flip-flop.

Typical examples of a nonvolatile semiconductor memory device include a flash memory which has a floating gate between a gate and a channel region of a transistor and stores data by holding an electric charge in the floating gate.

Any of the transistors described in Embodiments 1 to 5 can be applied to some of transistors included in the above-described semiconductor memory device.

First, a specific example of a memory cell included in a semiconductor memory device to which any of the transistors described in Embodiments 1 to 5 is applied will be described with reference to FIGS. 17A to 17C.

Figure 17A:
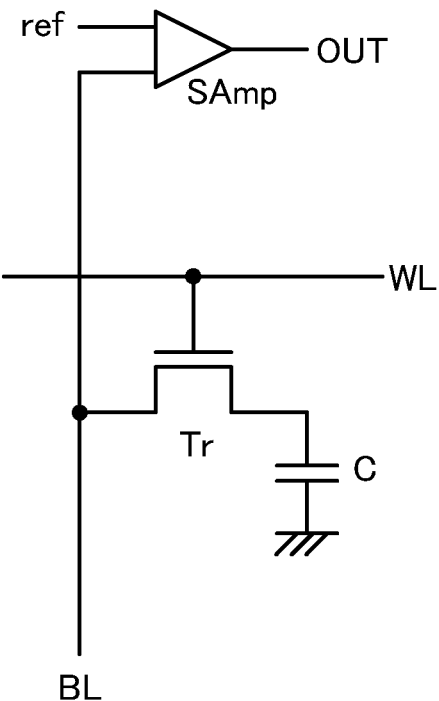
FIGS. 17A to 17C are a circuit diagram and a cross-sectional view illustrating an example of a semiconductor memory device according to one embodiment of the present invention, and a graph showing electrical characteristics thereof.

A memory cell includes a bit line BL, a word line WL, a sense amplifier SAmp, a transistor Tr, and a capacitor C (see FIG. 17A).

Figure 17B:
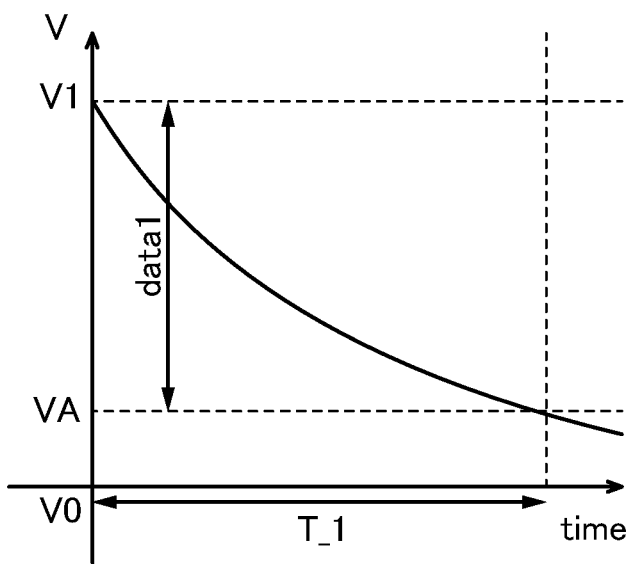

Note that it is known that the voltage held in the capacitor C is gradually decreased with time as shown in FIG. 17B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

Here, when any of the transistors described in Embodiments 1 to 5 is used as the transistor Tr, the holding period T_1 can be increased because the off-state current of the transistor is extremely small. That is, frequency of the refresh operation can be reduced; thus, power consumption can be reduced. For example, in the case where a memory cell is formed using the transistor Tr having an off-state current of $1\times10^{-21}$ A to $1\times10^{-25}$ A, data can be held for several days to several decades without supply of electric power.

When any of the transistors described in Embodiments 1 to 5 is used as the transistor Tr, the area of the memory cell can be made smaller because the transistor is miniaturized. Accordingly, the integration degree of the semiconductor memory device can be increased.

Figure 17C:
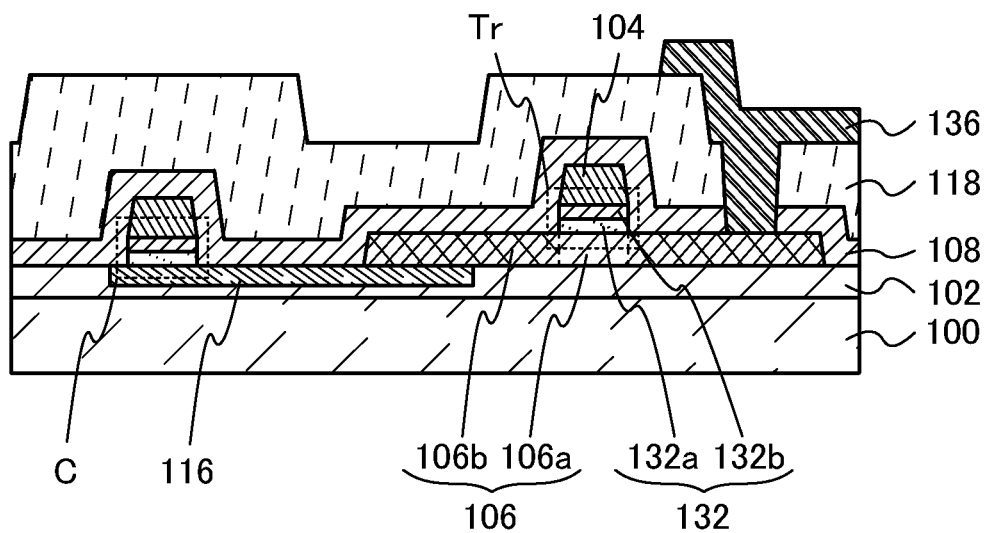

FIG. 17C illustrates an example of a cross-sectional structure of the memory cell. Note that in FIG. 17C, the transistor in FIGS. 4A to 4C is used as the transistor Tr. Therefore, for components of the transistor Tr which are not described below, the description in Embodiment 1 or the like can be referred to.

Here, the capacitor C over the base insulating film 102 includes an electrode 116 which is in contact with the region 106b of the transistor Tr; an insulating layer which is formed from the same layer and the same material as the gate insulating film 132; and an electrode (capacitor electrode) which is formed from the same layer and the same material as the gate electrode 104. Note that the electrode 116 is embedded in the base insulating film 102 in FIG. 17C; however, the shape of the electrode 116 is not limited thereto. The electrode 116 may have any shape as long as the electrode 116 is provided over the base insulating film 102 and in contact with the region 106b of the transistor Tr.

The electrode 116 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The word line WL is electrically connected to the gate electrode 104. The bit line BL is electrically connected to the wiring 136.

In the memory cell in FIG. 17C, the transistor Tr and the capacitor C include the electrodes formed from the same layer and the same material and the insulating films formed from the same layer and the same material; thus, the number of manufacturing steps can be reduced and the productivity can be improved. However, the transistor Tr and the capacitor C do not necessarily include the electrodes formed from the same layer and the same material and the insulating films formed from the same layer and the same material. For example, the area of the memory cell may be made smaller by providing the transistor Tr and the capacitor C so as to overlap with each other.

As described above, according to one embodiment of the present invention, a semiconductor memory device with high degree of integration and low power consumption can be provided.

Next, a memory cell in a semiconductor device including any of the transistors in Embodiments 1 to 5, which is a different example from FIGS. 17A to 17C, will be described with reference to FIGS. 18A to 18C.

Figure 18A:
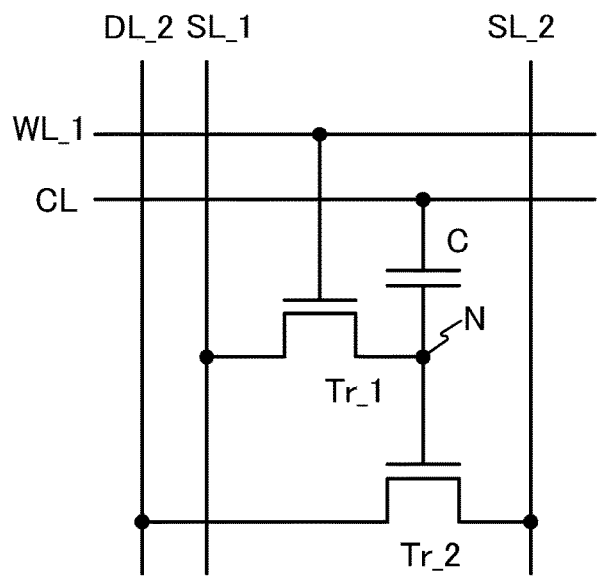
FIGS. 18A to 18C are a circuit diagram and a cross-sectional view illustrating an example of a semiconductor memory device according to one embodiment of the present invention, and a graph showing electrical characteristics thereof.
Figure 18B:
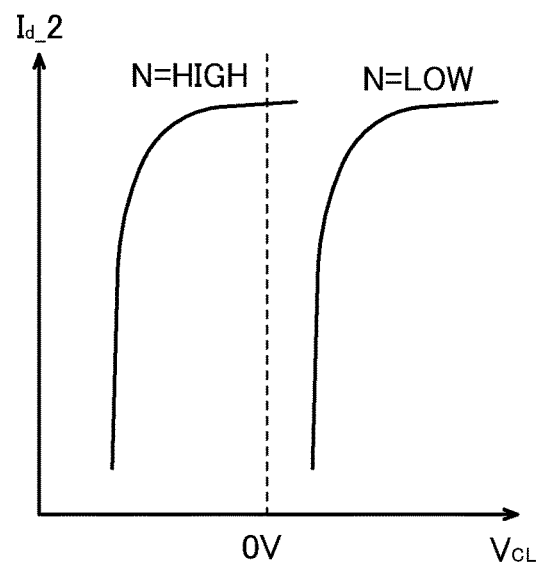

FIG. 18A is a circuit diagram of a memory cell. The memory cell includes a transistor Tr_1, a word line WL_1 electrically connected to a gate of the transistor Tr_1, a source line SL_1 electrically connected to a source of the transistor Tr_1, a transistor Tr_2, a source line SL_2 electrically connected to a source of the transistor Tr_2, a drain line DL_2 electrically connected to a drain of the transistor Tr_2, a capacitor C, a capacitor line CL electrically connected to one terminal of the capacitor C, and a node N electrically connected to the other terminal of the capacitor C, a drain of the transistor Tr_1, and a gate of the transistor Tr_2.

The semiconductor memory device described in this embodiment utilizes variation in the apparent threshold voltage of the transistor Tr_2, which depends on the potential of the node N. For example, FIG. 18B shows a relation between a voltage $V_{CL}$ of the capacitor line CL and a drain current $I_d\_2$ flowing through the transistor Tr_2.

The potential of the node N can be controlled through the transistor Tr_1. For example, the potential of the source line SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_d\_2$ curve (N=LOW) or a $V_{CL}$-$I_d\_2$ curve (N=HIGH) can be obtained. That is, when N=LOW, $I_d\_2$ is small at a $V_{CL}$ of 0V; accordingly, data 0 is stored. Further, when N=HIGH, $I_d\_2$ is large at a $V_{CL}$ of 0V; accordingly, data 1 is stored. In such a manner, data can be stored.

Here, when any of the transistors described in Embodiments 1 to 5 is used as the transistor Tr_1, the off-state current of the transistor can be significantly reduced; therefore, unintentional leakage of an electric charge accumulated in the node N by flowing between the source and the drain of the transistor Tr_1 can be suppressed. As a result, data can be held for a long time. Since high voltage is not needed in data writing, power consumption can be made small and operation speed can be high as compared to a flash memory or the like.

When any of the transistors described in Embodiments 1 to 5 is used as the transistor Tr_1, the area of the memory cell can be made smaller because the transistor is miniaturized. Accordingly, the integration degree of the semiconductor memory device can be increased.

Figure 18C:
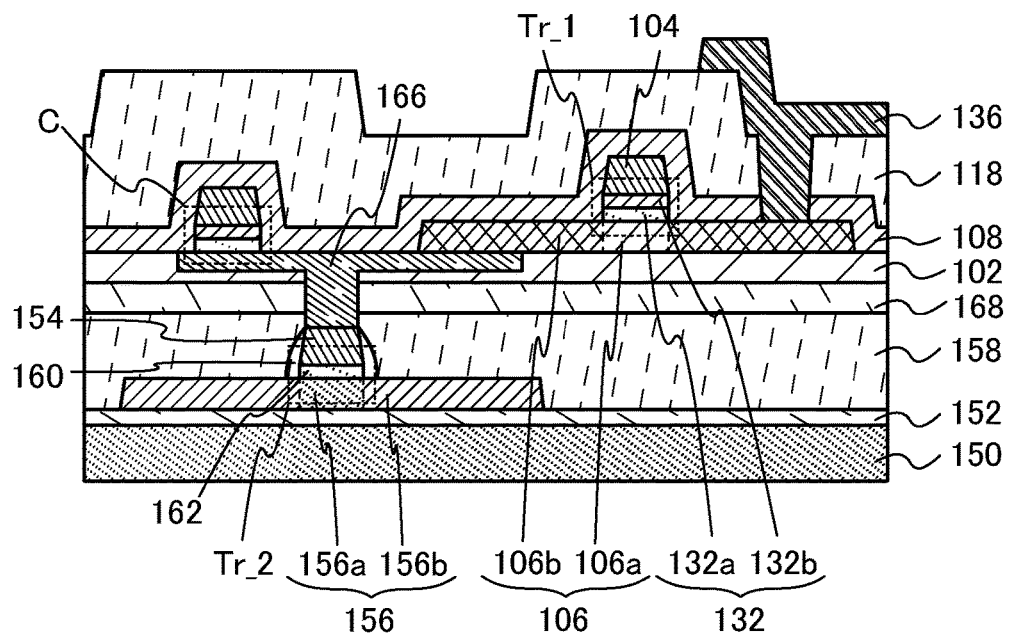

FIG. 18C illustrates an example of a cross-sectional structure of the memory cell. Note that in FIG. 18C, the transistor in FIGS. 4A to 4C is used as the transistor Tr_1. Therefore, for components of the transistor Tr_1 which are not described below, the description in Embodiment 1 or the like can be referred to.

In this embodiment, the case where a transistor including silicon is used as the transistor Tr_2 will be described. Note that any of the transistors described in Embodiments 1 to 5 may be used as the transistor Tr_2.

The transistor including silicon has an advantage that on-state characteristics can be easily improved in comparison with the transistors described in Embodiments 1 to 5. Therefore, it can be said that the transistor including silicon is suitable for not the transistor Tr_1 for which small off-state current is required but the transistor Tr_2 for which excellent on-state characteristics are required.

Here, the transistor Tr_2 includes a base insulating film 152 provided over a substrate 150; a silicon film 156 which is provided over the base insulating film 152 and includes a region 156a and regions 156b; a gate insulating film 162 provided over the silicon film 156; a gate electrode 154 which is provided over the gate insulating film 162 so as to overlap with the silicon film 156; and a sidewall insulating films 160 in contact with sidewalls of the gate insulating film 162 and the gate electrode 154.

Note that an interlayer insulating film 158 is provided over the transistor Tr_2, and a hydrogen-containing layer 168 is provided over the interlayer insulating film 158.

The substrate 150 may be formed using a material similar to that for the substrate 100.

The base insulating film 152 may be formed using a material similar to that for the base insulating film 102.

A silicon film such as a single crystal silicon film or a polycrystalline silicon film may be used as the silicon film 156.

The region 156a functions as a channel region. The regions 156b function as a source region and a drain region.

Note that the silicon film is used for the channel region and the source and drain regions in this embodiment; however, in the case where the substrate 150 is a semiconductor substrate such as a silicon wafer, the channel region and the source and drain regions may be provided in the semiconductor substrate.

The gate insulating film 162 may be formed using a material similar to that for the gate insulating film 112.

The gate electrode 154 may be formed using a material similar to that for the gate electrode 104.

The sidewall insulating films 160 may be formed using a material similar to that for the sidewall insulating films 310.

The interlayer insulating film 158 may be formed using a material similar to that for the interlayer insulating film 118. Note that a resin film of a polyimide resin, an acrylic resin, an epoxy resin, a silicone resin, or the like may be formed over the interlayer insulating film 158.

The hydrogen-containing layer 168 is formed using an insulating film in which the hydrogen concentration measured by secondary ion mass spectrometry (SIMS) is $1\times10^{21}$ atoms/cm$^3$ or higher.

The hydrogen-containing layer 168 may be formed using, for example, a silicon nitride oxide film or a silicon nitride film.

Since the transistor Tr_2 is a transistor including silicon, the electric characteristics of the transistor Tr_2 can be improved by terminating dangling bonds on a surface of the silicon film 156 with hydrogen. For that reason, hydrogen is preferably supplied from the hydrogen-containing layer 168. Note that this embodiment is not limited to the structure where the hydrogen-containing layer 168 is provided. For example, hydrogen may be supplied to the transistor Tr_2 without using the hydrogen-containing layer 168.

Although not illustrated, a layer having low hydrogen permeability may be provided between the hydrogen-containing layer 168 and the base insulating film 102. The transistor Tr_1 is a transistor including an oxide semiconductor film. Since hydrogen serves as a source of carriers in the oxide semiconductor film, hydrogen is preferably prevented from entering the oxide semiconductor film as much as possible. For that reason, in the case where the hydrogen-containing layer 168 is provided, diffusion of hydrogen to the transistor Tr_1 is preferably prevented by the layer having low hydrogen permeability.

Note that the layer having low hydrogen permeability is formed using, for example, an insulating film through which hydrogen does not pass even when heat treatment is performed at 350° C. for one hour.

The capacitor C over the base insulating film 102 includes an electrode 166 which is in contact with the region 106b of the transistor Tr_1; an insulating layer which is formed from the same layer and the same material as the gate insulating film 132; and an electrode (capacitor electrode) which is formed from the same layer and the same material as the gate electrode 104. The electrode 166 is in contact with the gate electrode 154 of the transistor Tr_2 through an opening provided in the base insulating film 102, the hydrogen-containing layer 168, and the interlayer insulating film 158. Note that the electrode 166 is embedded in the base insulating film 102 in FIG. 18C; however, the shape of the electrode 166 is not limited thereto. The electrode 166 may have any shape as long as the electrode 166 is provided over the base insulating film 102 and in contact with the region 106b of the transistor Tr_1 and the gate electrode 154 of the transistor Tr_2.

The electrode 166 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The word line WL_1 is electrically connected to the gate electrode 104. The source line SL_1 is electrically connected to the wiring 136. The capacitor line CL is electrically connected to the capacitor electrode.

In the memory cell in FIG. 18C, the transistor Tr_1 and the capacitor C include the electrodes formed from the same layer and the same material and the insulating films formed from the same layer and the same material; thus, the number of manufacturing steps can be reduced and the productivity can be improved. However, the transistor Tr_1 and the capacitor C do not necessarily include the electrodes formed from the same layer and the same material and the insulating films formed from the same layer and the same material. For example, the area of the memory cell may be made smaller by providing the transistor Tr_1 and the capacitor C so as to overlap with each other.

As described above, according to one embodiment of the present invention, a semiconductor memory device with high degree of integration and low power consumption can be provided.

This embodiment can be implemented in appropriate combination with any of the other embodiments.

Embodiment 7

A central processing unit (CPU) can be formed using any of the transistors described in Embodiments 1 to 5 or the semiconductor memory device described in Embodiment 6 for at least part of the CPU.

Figure 19A:
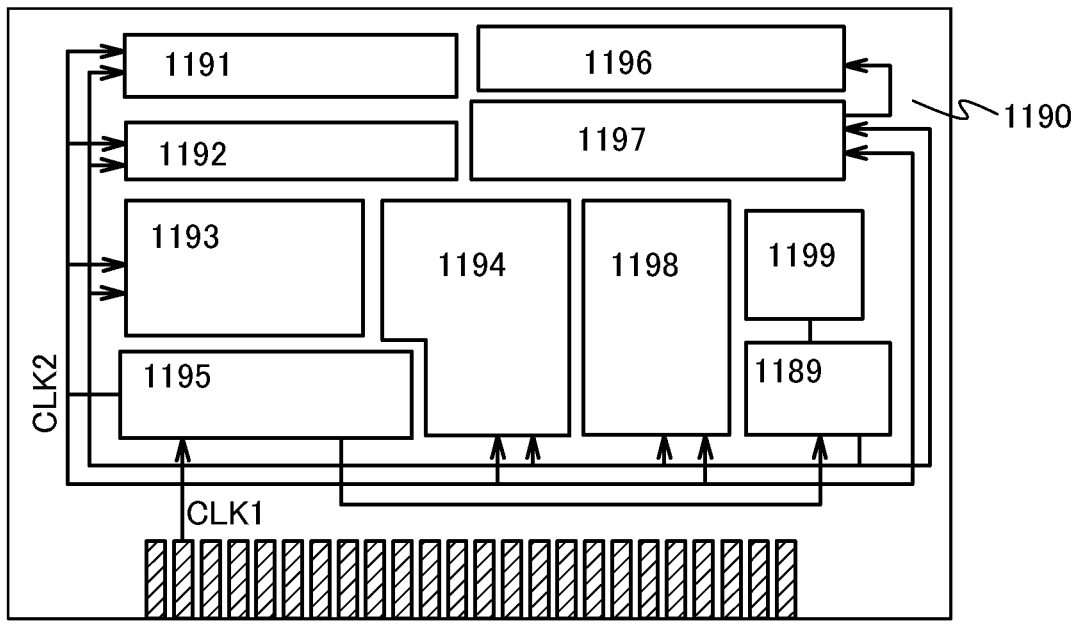
FIGS. 19A to 19C are a block diagram illustrating a specific example of a CPU according to one embodiment of the present invention, and circuit diagrams each illustrating part of the CPU.

FIG. 19A is a block diagram illustrating a specific structure of the CPU. The CPU illustrated in FIG. 19A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 19A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 19A, a memory element is provided in the register 1196. As the memory element in the register 1196, for example, the semiconductor memory device described in Embodiment 6 can be used.

In the CPU illustrated in FIG. 19A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 19B:
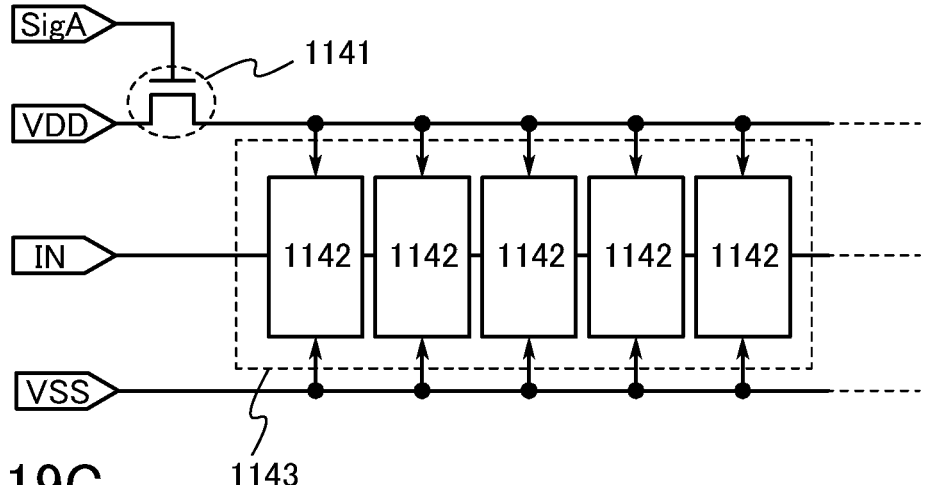
Figure 19C:
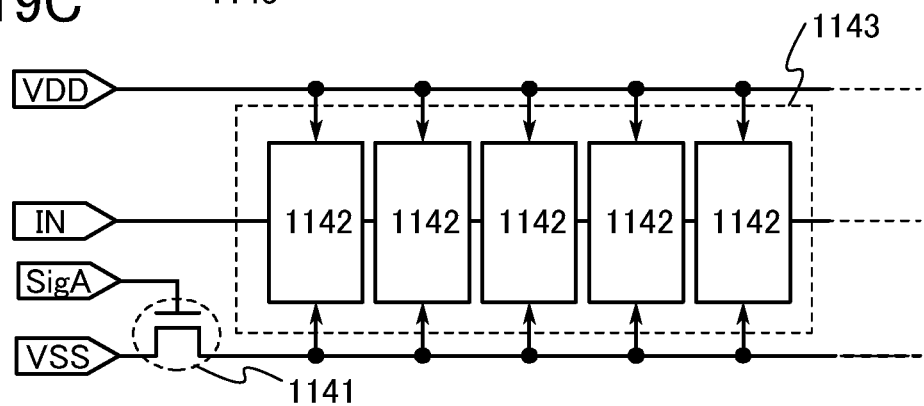

A switching element provided between a memory element group and a node to which a power supply potential VDD or a power supply potential VSS is supplied, as illustrated in FIG. 19B or FIG. 19C, allows the power supply voltage to be stopped. Circuits illustrated in FIGS. 19B and 19C will be described below.

FIGS. 19B and 19C each illustrate an example of a structure including any of the transistors described in Embodiments 1 to 5 as a switching element for controlling supply of a power supply potential to a memory element.

The memory device illustrated in FIG. 19B includes a switching element 1141 and a memory element group 1143 including a plurality of memory elements 1142. Specifically, as each of the memory elements 1142, the semiconductor memory device described in Embodiment 6 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 19B, a transistor with an extremely small off-state current is used as the switching element 1141, and the switching of the transistor is controlled by a signal SigA supplied to a gate thereof.

Note that FIG. 19B illustrates the structure in which the switching element 1141 includes only one transistor; however, without limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 19C, an example of a memory device in which each of the memory elements 1142 included in the memory element group 1143 is supplied with the low-level power supply potential VSS through the switching element 1141 is illustrated.

The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor and the semiconductor memory device can also be applied to an LSI such as a digital signal processor (DSP), a custom LSI, or a field programmable gate array (FPGA).

This embodiment can be implemented in appropriate combination with any of the other embodiments.

Embodiment 8

In this embodiment, examples of an electronic device to which any of Embodiments 1 to 7 is applied will be described.

Figure 20A:
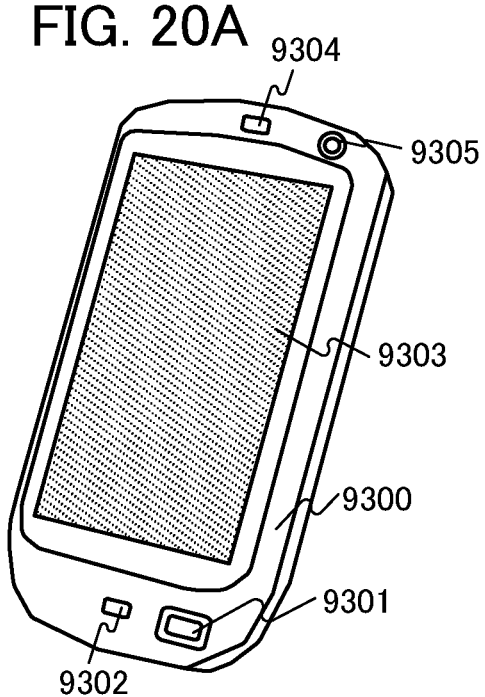
FIGS. 20A to 20D are perspective views each illustrating an example of an electronic device according to one embodiment of the present invention.

FIG. 20A illustrates a portable information terminal. The portable information terminal illustrated in FIG. 20A includes a housing 9300, a button 9301, a microphone 9302, a display portion 9303, a speaker 9304, and a camera 9305, and has a function as a mobile phone. One embodiment of the present invention can be applied to an arithmetic unit, a wireless circuit, or a memory circuit in a main body.

Figure 20B:
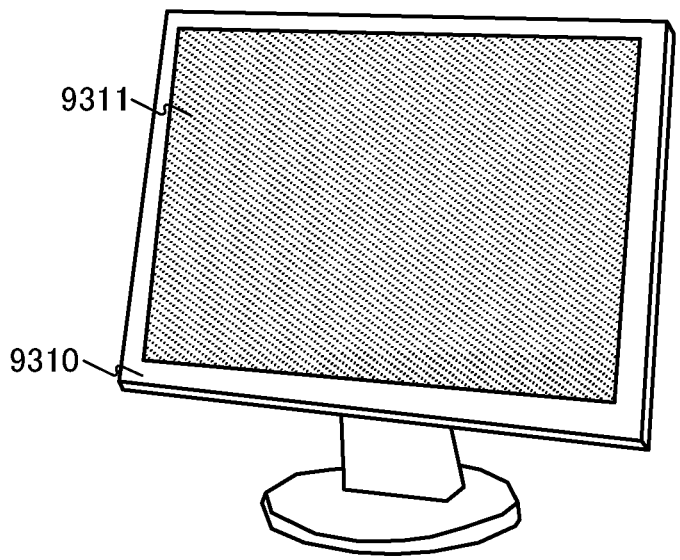

FIG. 20B illustrates a display, which includes a housing 9310 and a display portion 9311. One embodiment of the present invention can be applied to an arithmetic unit, a wireless circuit, or a memory circuit in a main body.

Figure 20C:
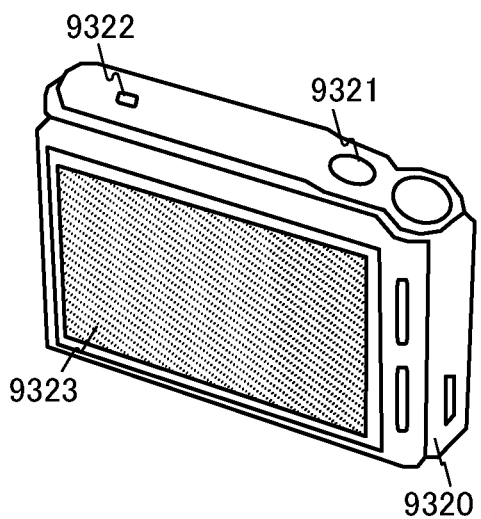

FIG. 20C illustrates a digital still camera. The digital still camera illustrated in FIG. 20C includes a housing 9320, a button 9321, a microphone 9322, and a display portion 9323. One embodiment of the present invention can be applied to an arithmetic unit, a wireless circuit, or a memory circuit in a main body.

Figure 20D:
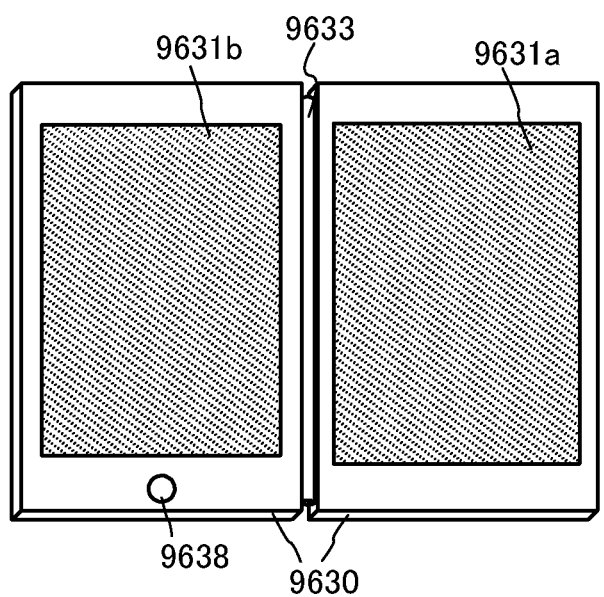
Figure 21A:
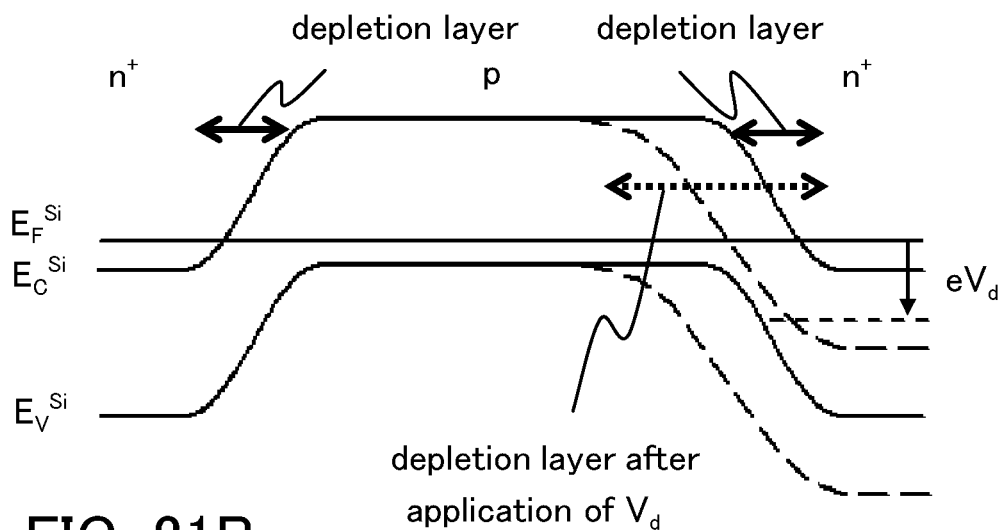
FIGS. 21A and 21B are each a band diagram between a source and a drain of a transistor including n-type silicon.
Figure 21B:
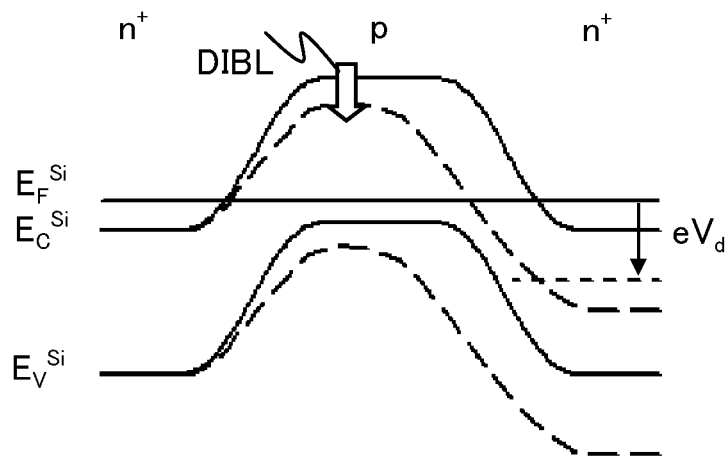
Figure 22:
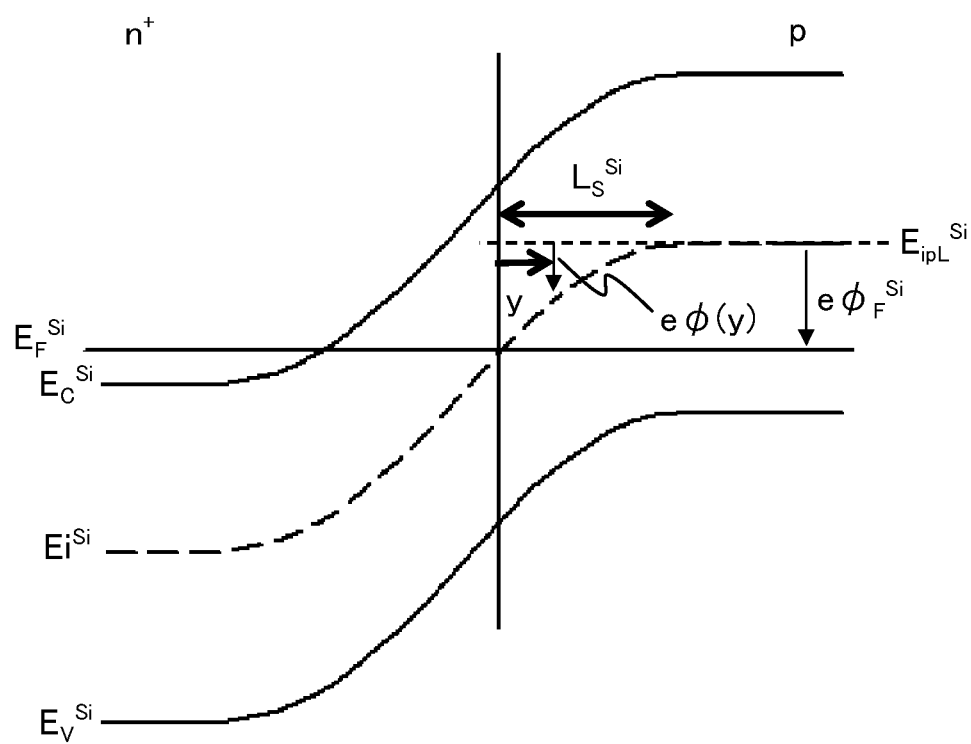
FIG. 22 is a band diagram on a source side of a transistor including n-type silicon.
Figure 23:
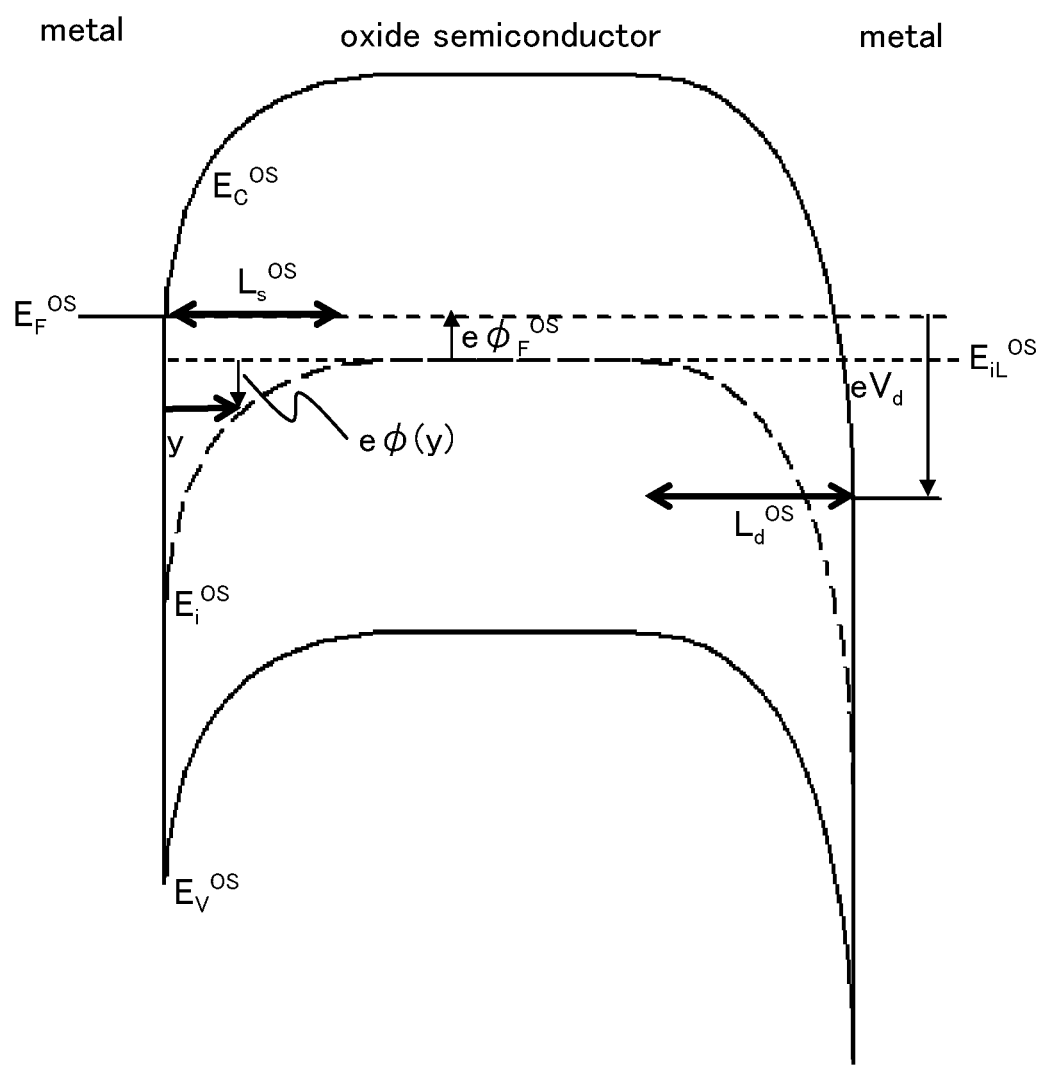
FIG. 23 is a band diagram between a source and a drain of a transistor including an oxide semiconductor film.

FIG. 20D illustrates a double-foldable portable information terminal. The double-foldable portable information terminal illustrated in FIG. 20D includes a housing 9630, a display portion 9631a, a display portion 9631b, a hinge 9633, and an operation switch 9638. One embodiment of the present invention can be applied to an arithmetic unit, a wireless circuit, or a memory circuit in a main body.

Part or the whole of the display portion 9631a and/or the display portion 9631b can function as a touch panel. By touching an operation key displayed on the touch panel, a user can input data, for example.

By using a semiconductor device according to one embodiment of the present invention, the performance of an electronic device can be improved and the power consumption of the electronic device can be reduced.

This embodiment can be implemented in appropriate combination with any of the other embodiments.

This application is based on Japanese Patent Application serial no. 2012-009722 filed with Japan Patent Office on Jan. 20, 2012, the entire contents of which are hereby incorporated by reference.

What is claimed is:

1. A semiconductor device comprising:
    a first transistor,
    a second transistor and
    a capacitor,
    wherein one of a source and a drain of the first transistor is electrically connected to the capacitor and a gate electrode of the second transistor,
    wherein the first transistor includes an oxide semiconductor layer in a channel formation region, a first conductive layer over the oxide semiconductor layer with a second insulating layer between the first conductive layer and the oxide semiconductor layer,
    wherein the second transistor includes a polycrystalline silicon layer in a channel formation region, and a fourth conductive layer configured to be the gate electrode of the second transistor,
    wherein the first conductive layer is configured to be a gate electrode of the first transistor, and the second insulating layer is configured to be a gate insulating layer of the first transistor,
    wherein a second conductive layer is of a same material as the first conductive layer, and is configured to be an electrode of the capacitor,
    wherein a third insulating layer is spaced apart from the second insulating layer, and is configured to be a dielectric layer of the capacitor,
    wherein a third conductive layer is in contact with a lower surface of the one of the source and the drain of the first transistor, and is configured to electrically connect the one of the source and the drain of the first transistor, the gate electrode of the second transistor, and the capacitor, wherein a first insulating layer is provided between the polycrystalline silicon layer and the third conductive layer, wherein a fourth insulating layer is in contact with a top surface of the oxide semiconductor layer, and a top surface of the third conductive layer, and wherein, in a cross-sectional view, the first conductive layer and the third conductive layer do not overlap each other.

2. The semiconductor device according to claim 1, wherein the oxide semiconductor layer is provided over the polycrystalline silicon layer.

3. A semiconductor device comprising:
a first transistor,
a second transistor and
a capacitor,
wherein one of a source and a drain of the first transistor is electrically connected to the capacitor and a gate electrode of the second transistor,
wherein the first transistor includes an oxide semiconductor layer in a channel formation region, a first conductive layer over the oxide semiconductor layer with a second insulating layer between the first conductive layer and the oxide semiconductor layer,
wherein the second transistor includes a polycrystalline silicon layer in a channel formation region, and a fourth conductive layer configured to be the gate electrode of the second transistor, wherein the first conductive layer is configured to be a gate electrode of the first transistor, and the second insulating layer is configured to be a gate insulating layer of the first transistor, wherein a second conductive layer is of a same material as the first conductive layer, and is configured to be an electrode of the capacitor, wherein a third insulating layer is spaced apart from the second insulating layer, and is configured to be a dielectric layer of the capacitor, wherein a third conductive layer is in contact with a lower surface of the one of the source and the drain of the first transistor, and is configured to electrically connect the one of the source and the drain of the first transistor, the gate electrode of the second transistor, and the capacitor, wherein a first insulating layer is provided between the polycrystalline silicon layer and the third conductive layer, wherein a fourth insulating layer is in contact with a top surface of the first conductive layer, a side surface of the second insulating layer, a top surface of the oxide semiconductor layer, a top surface of the third conductive layer, a side surface of the third insulating layer and a top surface of the second conductive layer and wherein, in a cross-sectional view, the first conductive layer and the third conductive layer do not overlap each other.

4. The semiconductor device according to claim 3, wherein the oxide semiconductor layer is provided over the polycrystalline silicon layer.

* * * * *